(12) United States Patent
Aoki

(10) Patent No.: US 7,825,403 B2
(45) Date of Patent: Nov. 2, 2010

(54) CIRCUIT BOARD INCLUDING A SUBSTRATE WITH A RECESSED PORTION AND MANUFACTURING METHOD THEREOF, ELECTRO-OPTICAL DEVICE AND ELECTRONIC APPARATUS

(75) Inventor: Takashi Aoki, Suwa (JP)

(73) Assignee: Seiko Epson Corporation (JP)

( * ) Notice: Subject to any disclaimer, the term of this patent is extended or adjusted under 35 U.S.C. 154(b) by 721 days.

(21) Appl. No.: 11/687,898

(22) Filed: Mar. 19, 2007

(65) Prior Publication Data

US 2007/0221958 A1 Sep. 27, 2007

(30) Foreign Application Priority Data

Mar. 23, 2006 (JP) ............................. 2006-081714

(51) Int. Cl.
*H01L 35/24* (2006.01)
*H01L 23/58* (2006.01)

(52) U.S. Cl. ........................ 257/40; 257/41; 257/642; 257/759; 257/E39.007; 257/E51.011; 257/E51.015; 257/E27.117; 438/82; 438/99; 438/623; 438/666; 438/780

(58) Field of Classification Search ................ 257/40, 257/41, 642, 759, E39.007, E51.007, E51.011, 257/E51.015, E27.117; 438/82, 99, 623, 438/666, 780

See application file for complete search history.

(56) References Cited

U.S. PATENT DOCUMENTS

| 2007/0031990 A1* | 2/2007 | Maekawa | .................... 438/99 |
| 2008/0048183 A1* | 2/2008 | Ohsawa et al. | ................ 257/40 |

FOREIGN PATENT DOCUMENTS

| JP | 2003-309268 | 10/2003 |
| JP | 2005-203728 | 7/2005 |
| JP | 2006-041127 | 2/2006 |
| WO | WO2004-107473 | 12/2004 |

* cited by examiner

Primary Examiner—Thanh V Pham
(74) Attorney, Agent, or Firm—Harness, Dickey & Pierce, P.L.C.

(57) ABSTRACT

A circuit board includes: a substrate; source and drain electrodes formed on the substrate; an organic semiconductor layer formed on the source and drain electrodes; a gate insulating layer formed on the organic semiconductor layer; and a gate electrode formed on the gate insulating layer, wherein: the substrate includes a first part, a second part, and a third part interposed between the first and second parts and a thickness of the first part or a thickness of the second part is greater than that of the third part; the source electrode is formed on the first part; the drain electrode is formed on the second part; a part of the organic semiconductor layer is formed on the third part; and a thickness of the gate insulating layer disposed on the first and second parts is smaller than that of the gate insulating layer disposed on the third part.

11 Claims, 7 Drawing Sheets

CIRCUIT BOARD INCLUDING A SUBSTRATE WITH A RECESSED PORTION AND MANUFACTURING METHOD THEREOF, ELECTRO-OPTICAL DEVICE AND ELECTRONIC APPARATUS

BACKGROUND

1. Technical Field

The present invention relates to a circuit board, a method of manufacturing a circuit board, an electro-optical device, and an electronic apparatus.

2. Related Art

Recently, organic thin-film field effect transistors using an organic semiconductor material have been attracting attention as devices for replacing thin-film field effect transistors using an inorganic material such as silicon. This is because organic thin-film field effect transistors can be manufactured conveniently, the characteristics of the material can be changed by changing the molecular structure of the organic semiconductor material, and organic thin-film field effect transistors are more flexible, lighter in weight, and stronger than thin film field effect transistors using an inorganic semiconductor. Generally, an organic transistor includes a gate electrode, a source electrode, a drain electrode, a semiconductor layer, an insulating layer, and a substrate. An example of an organic transistor is disclosed in JP-A-2005-203728.

However, there are problems in that organic transistors have a large off-current and it is not possible to miniaturize the element. There is a problem in that the performance of organic transistors cannot be excellent since carrier injection between the source and drain electrodes and the organic semiconductor layer is not sufficient.

SUMMARY

An advantage of some aspects of the invention is that it provides a circuit board including a substrate, a gate electrode, a gate insulating layer, a source electrode, and a drain electrode, and an organic semiconductor layer with decreased off-current.

According to a first aspect of the invention, there is provided a circuit board comprising: a substrate; source and drain electrodes formed on the substrate; an organic semiconductor layer formed on the source and drain electrodes; a gate insulating layer formed on the organic semiconductor layer; and a gate electrode formed on the gate insulating layer. The substrate includes a first part, a second part, and a third part interposed between the first and second parts and a thickness of the first part or a thickness of the second part is greater than that of the third part. The source electrode is formed on the first part. The drain electrode is formed on the second part. A part of the organic semiconductor layer is formed on the third part. A thickness of the gate insulating layer disposed on the first and second parts is smaller than that of the gate insulating layer disposed on the third part.

Accordingly, a boundary area between the gate insulating layer and the organic semiconductor layer is increased, an off-current is reduced, and carrier injection is improved, thereby reducing an absolute value of a threshold voltage and improving a mobility.

A difference between a thickness of the first part or the second part and that of the third part may be greater than a thickness of a part of the organic semiconductor layer which is formed on the third part in the circuit board.

Accordingly, a boundary area between the gate insulating layer and the organic semiconductor layer is increased and carrier injection is improved, thereby reducing an absolute value of a threshold voltage and improving a mobility. Further, it becomes possible to conveniently configure the boundary surface between the gate insulating layer and the organic semiconductor layer on the substrate side, thereby improving the operation of the circuit board.

According to a second aspect of the invention, there is provided a circuit board comprising: a substrate; a source electrode, a drain electrode, and a gate electrode disposed on one side of the substrate; a gate insulating layer insulating the source electrode and the drain electrode from the gate electrode; an organic semiconductor layer disposed to contact the gate insulating layer; and a recessed portion, a bottom surface of which is disposed inside the substrate or on the substrate side disposed in a region between the source electrode and the drain electrode on which the organic semiconductor layer is formed, wherein a boundary surface between the organic semiconductor layer and the gate insulating layer is configured to be closer to a bottom surface of the substrate than boundary surfaces between the organic semiconductor layer and the gate insulating layer in other regions.

In this case, a boundary area between the gate insulating layer and the organic semiconductor layer is increased, an off-current is reduced, and carrier injection is improved, thereby reducing an absolute value of a threshold voltage and improving a mobility.

A part of the organic semiconductor layer located in the region between the source electrode and the drain electrode may be disposed inside the substrate in the circuit board.

In this case, a boundary area between the gate insulating layer and the organic semiconductor layer is more increased, an off-current is reduced assuredly, and carrier injection is improved, thereby reducing an absolute value of a threshold voltage and improving a mobility.

The recessed portion may be formed in the region between the source electrode and the drain electrode in the circuit board.

In this case, it becomes possible to conveniently configure a boundary surface between the gate insulating layer and the organic semiconductor layer on the substrate side.

The recessed portion may have a depth in the range 1 to 1000 nm in the circuit board.

In this case, it becomes possible to easily configure a boundary surface between the gate insulating layer and the organic semiconductor layer on the substrate side, thereby improving the operation of the circuit board.

That an average thickness of the organic semiconductor layer may be equal to or smaller than a depth of the recessed portion in the circuit board.

In this case, an off-current is reduced even more assuredly and carrier injection is improved, thereby assuredly reducing an absolute value of a threshold voltage and improving a mobility.

A boundary surface between the organic semiconductor layer and the gate insulating layer in a region between the source electrode and the drain electrode may be configured to be the same distance from or closer to the bottom surface of the substrate as/than boundary surfaces between the source electrode and the substrate and between the drain electrode and the substrate.

In this case, an off-current is reduced assuredly, and carrier injection is improved, thereby assuredly reducing an absolute value of a threshold voltage and improving a mobility.

The substrate may include a base body and a base insulating layer formed on the base body in the circuit board.

In this case, a boundary area between the gate insulating layer and the organic semiconductor layer can be increased more, an off-current is reduced, and carrier injection is improved, thereby reducing an absolute value of a threshold voltage and improving a mobility.

According to a third aspect of the invention, there is provided a method of manufacturing a circuit board including a substrate, a source electrode, a drain electrode, a gate electrode, a gate insulating layer, and an organic semiconductor layer, the method comprising: forming the source electrode and the drain electrode on one side of the substrate together with forming a recessed portion, a bottom surface of which is disposed inside the substrate or on the substrate side in a region between the source electrode and the drain electrode; forming a boundary surface between the organic semiconductor layer and the gate insulating layer in a region between the source electrode and the drain electrode such that the boundary surface is configured to be closer to a bottom surface of the substrate than boundary surfaces between the organic semiconductor layer and the gate insulating layer in other regions;

forming the gate insulating layer to contact the organic semiconductor layer; and forming the gate electrode for the source electrode and the drain electrode through the gate insulating layer.

In this case, a boundary area between the gate insulating layer and the organic semiconductor layer is increased, an off-current is reduced assuredly, and carrier injection is improved, thereby reducing an absolute value of a threshold voltage, and accordingly, it becomes possible to conveniently acquire a circuit board in which a mobility is improved.

The substrate may include a base body and a base insulating layer. The method may further include forming the base insulating layer to contact the base body before forming the source electrode and the drain electrode, and the recessed portion may be formed on the base insulating layer In this case, it becomes possible to acquire a circuit board of which a boundary area between the gate insulating layer and the organic semiconductor layer is much increased.

In the method, the forming of the recessed portion in a region between the source electrode and the drain electrode may be performed by etching with a mask for source electrode and the drain electrode.

In this case, it becomes possible to conveniently etch a region between the source electrode and the drain electrode.

In the method, the etching may be performed by using oxygen plasma.

In this case, it becomes possible to etch a region between the source electrode and the drain electrode more conveniently.

According to a fourth aspect of the invention, there is provided an electro-optical device including the circuit board according to the first aspect of the invention.

In this case, it becomes possible to provide an electro-optical device having a high performance.

According to a fifth aspect of the invention, there is provided an electronic apparatus including the electro-optical device according to the fifth aspect of the invention.

In this case, it becomes possible to provide an electronic apparatus having a high performance.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a circuit board, a method of manufacturing a circuit board, an electro-optical device, and an electronic apparatus according to embodiments of the present invention will now be described in detail with reference to figures.

First Embodiment

First, a circuit board according to a first embodiment of the invention will now be described.

(1) Circuit Board

Figure 1:
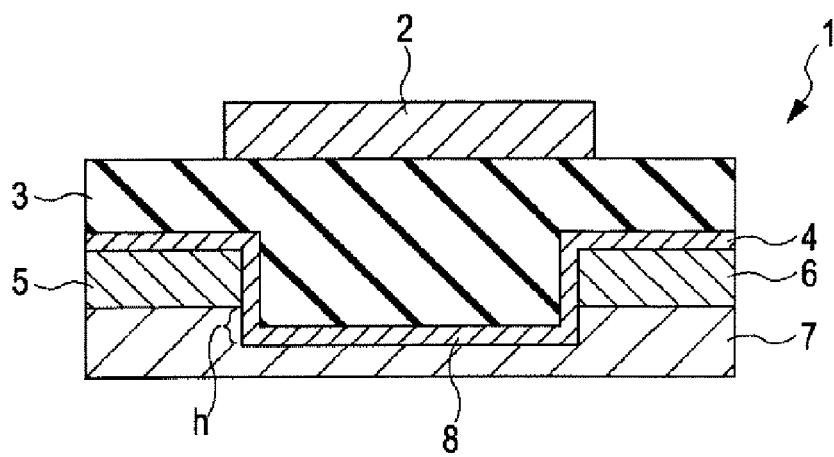
FIG. 1 is a schematic diagram of a circuit board according to a first embodiment of the present invention.

FIG. 1 is a schematic longitudinal sectional view of a circuit board 1 according to an embodiment of the invention. Hereinafter, an upper side in FIG. 1 is referred to as up, and a lower side in FIG. 1 is referred to as down.

The circuit board 1 shown in FIG. 1 includes a gate electrode 2, a gate insulating layer 3, an organic semiconductor layer 4, a source electrode 5, a drain electrode 6, a substrate 7, and a recessed portion 8, and has a top-gate/bottom-contact type structure.

Hereinafter, structures of the components will be described one after another.

The gate electrode 2 is used for providing an electric field to the organic semiconductor layer 4. The gate electrode 2 is disposed on one side of the substrate 7 to contact the gate insulating layer 3 without contacting the source electrode 5 and the drain electrode 6.

The material of the gate electrode 2 is a material having conductivity and is not limited to a specific material. More specifically, for example, the material may be a metal such as chromium, aluminum, tantalum, molybdenum, niobium, copper, silver, gold, platinum, palladium, indium, nickel, and neodymium, or an alloy thereof, a conductive metallic oxide such as zinc oxide, tin oxide, indium oxide, and gallium oxide, a conductive mixed metal oxide such as indium-tin oxide (hereinafter abbreviated as ITO), indium-zinc mixed oxide (hereinafter, abbreviated as "IZO"), aluminum-zinc mixed oxide (AZO), and gallium-zinc mixed oxide (GZO), a conductive polymer material such as polyaniline, polypyrrole, polythiophene, and polyacetylene, a conductive polymer material to which a dopant has been added such as an acid including hydrochloric acid, sulfuric acid, sulfonic acid, Lewis acid including phosphorous hexa fluoride, arsenic pentafluoride, iron chloride, a halogen atom including iodine, and a metal atom including sodium and potassium, or a conductive mixed material in which carbon black or metallic particles are dispersed. In addition, a polymer mixture containing conductive particles such as metallic fine particles and graphite may be used. One or a combination of two or more of the materials described above may be used. Among the aforementioned materials, preferably a metal alloy may be used preferably, and, more preferably, a gold-chromium metal alloy may be used. By using the aforementioned material, a circuit board 1 having superior characteristics in that an electric current of adequate magnitude flows can be acquired.

The average thickness of the gate electrode 2 is not limited to a specific range. However, the average thickness of the gate electrode 2 may be preferably, approximately in the range of 0.1 to 2000 nm and, more preferably, in the range of 1 to 1000 nm.

The gate insulating layer 3 is insulates the source electrode 5 and the drain electrode 6 from the gate electrode 2. The gate insulating layer 3 is disposed on one side of the substrate 7 to contact the gate electrode 2 and the organic semiconductor layer 4.

The material of the gate insulating layer 3 is not limited to a specific material and may be any material having an insulating property, and any known organic material or inorganic material may be used as the material.

As the organic material, vinyl polymer such as polymethyl methacrylate, polyvinyl alcohol, polyvinyl acetate, and polyvinyl phenol or a polymer such as polystyrene, polyimide, polycarbonate, aromatic polyester, polyarylate, and a polymer of a compound represented by general formula 1. One or a combination of two or more materials may be used from among the aforementioned materials As the inorganic material, a metal oxide such as silicon oxide, aluminum oxide, tantalum oxide, zirconium oxide, cerium oxide, zinc oxide, cobalt oxide, metal nitride such as silicon nitride, aluminum nitride, zirconium nitride, cerium nitride, zinc nitride, cobalt nitride, titanium nitride, and tantalum nitride, or a mixed metal oxide such as barium strontium titanate and zirconium lead titanate may be used. One or a combination of two or more of the aforementioned materials may be used.

Among the aforementioned materials, preferably, an organic material may be used, and, more preferably, polymethylmethacrylate or a compound represented by a general formula 1 to be described below may be used. By using such a material, the insulating property can be improved. Moreover, when the compound represented by the general formula 1 to be described below is used, it is considered that electrons are attracted from the organic semiconductor layer 4 suppressing the movement of holes and, accordingly, a marked improvement of mobility and reduction of a threshold voltage can be achieved.

The above-mentioned material is included in the gate insulating layer 3. Preferably, the material may be contained as a primary material, and, more preferably, a composition ratio of the material may be in the range of 50 to 100 wt %, and, even more preferably, in the range of 70 to 100 wt %. In this case, an appropriate insulating effect can be acquired and when the compound represented by the general formula 1 is used, it is considered that electrons are attracted appropriately from the organic semiconductor layer 4 improving the mobility and reducing a threshold voltage. The compounds represented by the general formula 1 will be described in detail later.

The average thickness of the gate insulating layer 3 is not limited to a specific range. However, preferably, the average thickness of the gate insulating layer 3 may be approximately in the range of 100 to 2000 nm, and, more preferably, in the range of 500 to 1500 nm. By controlling the average thickness of the gate insulating layer 3 in the range described above, the operating voltage of the circuit board 1 can be lowered. Here, the average thickness of the gate insulating layer 3 is a thickness of the gate insulating layer 3 on the recessed portion 8. It is preferable that the thickness of the gate insulating layer 3 on the recessed portion is greater than that of the gate insulating layer 3 on the source electrode 5 and the drain electrode 6.

The organic semiconductor layer 4 enables a current to flow from the source electrode 5 to the drain electrode 6 according to an electric field applied by the gate electrode 2. The organic semiconductor layer 4 is disposed on one side of the substrate 7 and formed to contact the gate insulating layer 3, the source electrode 5, the drain electrode 6, and the substrate 7.

The material of the organic semiconductor layer 4 is not limited to a specific material so long as the material has semiconductor characteristics. For example, an α-oligothiophene such as poly(3-alkythiophene), poly(3-hexylthiophene) (P3HT), poly(3-octylthiophene), poly(2,5-thienylenevinylene) (PTV), guarterthiophene (4T), sexithiophene (6T), and octathiophene, a thiophene derivative such as 2,5-bis(5-biphenyl-2'-thienyl)-thiophene (BPT3) and 2,5-[2,2'-(5,5'-diphenyl)dithienyl]-thiophene, a phenylenevinylene derivative such as poly(para-phenylenevinylene) (PPV), a fluorene derivative such as poly(9,9-dioctylfluorene) (POX), an acene compound such as a triallylamine-based polymer, anthracene, tetracene, pentacene, and hexacene, a benzene (TPQ2) derivative such as 1,3,5-tris[(3-phenyl-6-tri-fluoromethyl)quinoxalin-2-yl]benzene (TPQ1) and 1,3,5-tris[{3-(4-t-butylphenyl)-6-trisfluoromethyl}quinoxalin-2-yl]benzene (TPQ2), a phthalocyanine derivative such as phthalocyanin, copper phthalocyanine (CuPc), and iron phthalocyanine, an organic metallic compound such as tris(8-hydroxyquinolinolate) aluminum (Alq3), factris(2-phenylpyridine)iridium (Ir(ppy)3), a polymer material such as C60, oxadiazole-based polymer, a triazole-based polymer, a carbazole-based polymer, and a fluorene-based polymer, or a fluorine-containing copolymer such as poly(9,9-dioctylfluorene-co-bis-N,N'-(4-methoxyphenyl)-bis-N,N'-phenyl-1,4-phenylenediamine) (PFMO), poly(9,9-dioctylfluorene-co-benzothiadiazole) (BT), fluorene-triallylamine copolymer, and poly(9,9-dioctylfluorene-co-dithiofene) (F8T2) may be used as the material. Among the aforementioned materials, one or a combination of two or more of the materials may be used. Among the aforementioned materials, preferably, the fluorine-containing copolymer may be used, and, more preferably, F8T2 may be used. Accordingly, semiconductor characteristics can be improved markedly.

Preferably, the average thickness of the organic semiconductor layer 4 may be in the range of 0.5 to 1000 nm and, more preferably, in the range of 1 to 500 nm. It is preferable that the average thickness of the organic semiconductor layer 4 is equal to or smaller than a depth h of the recessed portion 8 to be described later. When the average thickness of the organic semiconductor layer 4 is in the aforementioned range, an appropriate electric current can flow, and accordingly, an advantage including improvement of the mobility can be acquired.

In a region of the organic semiconductor layer 4 between the source electrode 5 and the drain electrode 6, a boundary surface between the organic semiconductor layer 4 and the gate insulating layer 3 may coincide with boundary surfaces between the source electrode 5 and the substrate 7 and between the drain electrode 6 and the substrate 7 or be closer to a bottom surface of the substrate 7 than the boundary surfaces between the source electrode 5 and the substrate 7 and between the drain electrode 6 and the substrate 7. Accordingly, the area of a boundary surface between the gate insulating layer 3 and the organic semiconductor layer 4 is further increased to reduce an off-current. In additions a decrease in an absolute value of a threshold voltage and improvement of the mobility can be achieved.

It is preferable that the organic semiconductor layer 4 is formed to have an average thickness which is the same as or smaller than the depth h of the recessed portion 8 since the area of the boundary surface is increased. In this case, the off-current can be reduced further. In addition, a decrease in an absolute value of a threshold voltage and improvement of the mobility can be achieved.

In addition, the area of the boundary surface increases when the position of the boundary surface is moved toward the substrate 7 side, and accordingly the distance (channel length) electrons have to travel between the source electrode 5 and the drain electrode 6 is increased inevitably.

The organic semiconductor layer 4 which is located in a region between the source electrode 5 and the drain electrode 6 is disposed inside the substrate 7. Accordingly, the area of a boundary surface between the gate insulating layer 3 and the organic semiconductor layer 4 is increased to further reduce the off-current. In addition, a decrease in an absolute value of a threshold voltage and improvement of the mobility can be achieved.

The source electrode 5 is disposed on the substrate 7 and formed to contact the organic semiconductor layer 4 and the substrate 7.

The material of the source electrode 5 is the same as the material of the gate electrode 2 described above.

The average thickness of the source electrode 5 is not limited to a specific range. However, preferably, the average thickness of the source electrode 5 may be in the range of 10 nm to 2000 nm, and, more preferably, in the range of 100 to 1000 nm. By having the average thickness of the source electrode 5 in the range described above, the conductivity can be improved markedly.

The configuration, material and average thickness of the drain electrode 6 is the same as that of the source electrode 5.

The source and drain electrodes 5 and 6 may be formed of the same compound or different compounds. However, it is preferable that the same compound is used for the source and drain electrodes 5 and 6. When the same compound is used, the circuit board 1 can be fabricated easily.

A distance (channel length) through which electrons move between the source electrode 5 and the drain electrode 6 may, preferably, be in the range of 0.1 to 100 μm, and, more preferably, in the range of 2 to 50 μm. When the distance is in the range described above, the off-current can be decreased even further, an absolute value of the threshold voltage is reduced, and the mobility is improved, so that the characteristics of the circuit board 1 can be improved.

Generally, when a large drain voltage is applied to a transistor having a short channel length, a large off-current flows between a source electrode and a drain electrode, and accordingly, the on-off characteristic of the transistor is deteriorated. However, according to this embodiment of the invention, the off-current can be suppressed. Accordingly, the transistor can be miniaturized, and when a plurality of the transistors are integrated with high density, the on-off characteristic of the transistors can be maintained as good.

In addition, the length (channel width) of the channel region through which electrons move between the source and the drain electrodes 5 and 6 in a direction perpendicular to the channel length may, preferably, be in the range of 0.05 to 5 mm and, more preferably, in the range of 0.1 to 3 mm. When the channel width is in the range described above, parasitic capacitance can be decreased to prevent the deterioration of characteristics of the circuit board 1.

The substrate 7 supports constituent layers (parts) of the circuit board 1. The substrate 7 may include a first part on which the source electrode 5 is formed, a second part on which the drain electrode 6 is formed, and, preferably, a third part on which the recessed portion 8 inserted between the first and second parts. In addition, it is preferable that the thickness of each of the first and second parts is greater than that of the third part. It is more preferable that the difference between the thicknesses of the first and second parts and the thickness of the third part is greater than the thickness of the organic semiconductor layer 4 disposed on the third part.

When the substrate 7 is a structure including a base body 10 to be described below, a base insulating layer 9 and the like may be formed on the substrate body 10. In other words, the substrate 7 may include a base body 10 and a base insulating layer 9.

As the substrate 7, for example, a glass substrate, a glass substrate, a quartz substrate, a silicon substrate, a metal substrate formed of molybdenum, copper, aluminum, stainless steel, magnesium, iron, nickel, gold, silver, or the like, a semiconductor substrate made of gallium-arsenide or the like, a plastic substrate, and the like may be used. Among the materials described above, preferably, the plastic substrate may be used.

As a material of the plastic substrate, a thermoplastic resin or a themorhardening resin may be used. For example, polyolefin such as polyethylene, polypropylene, ethylene-propylene copolymer, and ethylene-vinyl acetate copolymer (EVA), polyester such as cyclic polyolefin, modified polyolefin, polyvinyl chloride, polyvinylidene chloride, polystyrene, polyamide, polyimide (PI), polyamideimide, polycarbonate, poly(4-methylpentene-1), ionomer, acrylic resin, polymethyl methacrylate, acryl-styrene copolymer (AS resin), butadiene-styrene copolymer, polio copolymer (EVOH), polyethylene terephthalate (PET), polybuthylene terephthalate, polyethylene naphthalate (PEN), and polycyclohexane terephthalate (PCT), various kinds of thermoplastic elastomer such as polyether, polyether ketone, polyether sulfone (PES), polyetherimyde, polyacetal, polypenylene oxide, modified polypenylene oxide, polyarylate, aromatic polyester (liquid crystal polymer), polytetrafluoroethylene, polyvinylidene fluoride, other fluorine-based resins, a styrene system, a polyolefin system, a polyvinylchloride system, a polyurethane system, a fluoro-rubber system, and a chlorinated polyethylene system, or epoxy resin, phenol resin, urea resin, melamine resin, unsaturated polyester, silicone resin, and polyurethane, and copolymer, blended substance, and polymer alloy mainly containing any of the materials described above may be used. Alternatively, a stacked body in which one or more layers of the aforementioned materials are stacked may be used.

The recessed portion 8 is used for increasing a boundary surface area of a region located between the source electrode 5 and the drain electrode 6 with the gate insulating layer 3 and the organic semiconductor layer 4 and improving an electrical connection between the source and drain electrodes 5 and 6 and the organic semiconductor layer 4. According to this embodiment of the invention, the recessed portion 8 is formed over almost all of a region of the substrate 7 interposed between the source electrode 5 and the drain electrode 6 before the organic semiconductor layer 4 is formed. The bottom side of the recessed portion 8 is inside the substrate, and inside the recessed portion 8, a part of the organic semiconductor layer 4 is formed. In this case, a boundary surface area of the recessed portion 8 with the gate insulating layer 3 and the organic semiconductor layer 4 is increased to reduce the off-current. In addition, an absolute value of the threshold voltage can be reduced, and the mobility can be improved.

A depth h of the recessed portion 8 may, preferably, be in the range of 1 to 1000 nm, and is, more preferably, in the range of 50 to 500 nm. When the depth of the recessed portion 8 is in the range described above, a distance between the source electrode 5 and the drain electrode 6 is increased to decrease the off-current, an absolute value of the threshold voltage can be reduced, and the mobility can be improved, and accordingly, the operation of the circuit board 1 can be improved.

By using the aforementioned structure, a circuit board 1 having a recessed portion 8 on the substrate 7 in which a boundary surface between the gate insulating layer 3 and the organic semiconductor layer 4 in the region interposed between the source electrode 5 and the drain electrode 6 is disposed closer to a bottom side of the substrate 7 than a boundary surface between the source and drain electrodes 5 and 6 and the substrate 7 can be acquired The circuit board 1, as an example, may be used as a transistor such as a thin film transistor, a transparent transistor, a transparent field effect transistor (transparent FET), an organic light emitting field effect transistor (organic light emitting FET), and a static induction transistor and as a switching element of an active matrix substrate which is used together with an electron optical element such as a liquid crystal element, a polymer dispersed liquid crystal, an electrophoretic image display, an electroluminescence device, and an electro chromic device. Moreover, by integrating a plurality of the transistors, a digital device or an analog device such as logic circuits including an AND gate, an OR gate, a NAND gate, and a NOT gate, a memory device, an oscillator, and an amplifier can be implemented. In addition, by combining the aforementioned devices, an IC card or an IC tag can be implemented.

(2) Method of Manufacturing Semiconductor Device

A method of manufacturing a circuit board 1 according to an embodiment of the invention will now be described. The circuit board 1 described above can be manufactured by the following method.

The method of manufacturing the circuit board 1 shown in FIG. 1 includes forming a source electrode 5 and a drain electrode 6 on a substrate 7 together with a recessed portion 6 (A1), forming an organic semiconductor layer 4 on the source electrode 5, the drain electrode 6, and the substrate 7 (A2), forming a gate insulating layer 3 on the organic semiconductor layer 4 (A3), and forming a gate electrode 2 on the gate insulating layer 3 (A4).

A1. Forming a Source Electrode and a Drain Electrode Together with a Recessed Portion Forming the source electrode 5 and the drain electrode 6 on the substrate 7.

It is preferable that a pre-treatment for improving the adherence of the electrode material to the substrate 7 is performed before forming the source and drain electrodes 5 and 6. As the pre-treatment, a surface treatment using a surface reforming material such as hexamethyldisilazane, cyclohexene, and octadecyltrichlorosilane, an organic washing treatment using acetone, isopropyl alcohol, or the like, an acid treatment using hydrochloric acid, sulfuric acid, acetic acid, or the like, an alkali treatment using sodium hydroxide, potassium hydroxide, calcium hydroxide, ammonia, or the like, a UV ozone treatment, a fluorination treatment, a plasma treatment using oxygen, argon, or the like, and a Langmuir-Blodgett film-forming treatment may be used. A plurality of treatments among the aforementioned treatments may be used. Among the aforementioned treatments, preferably, the organic washing treatment may be used. By performing the pre-treatment, degreasing of the surface can be performed, and the source electrode 5 and the drain electrode 6 can be formed with excellent adherence.

Next, a conduction film is formed on the substrate 7 by using a vacuum film-forming method such as a sputtering method, a chemical vapor deposition (CVD) method such as plasma CVD, thermal CVD, and laser CVD, a dry coating method such as vacuum vapor deposition and ion plating, a wet coating method such as electrolytic plating, immersion plating, and electroless plating, an ink jet method, a thermal spray method, a sol-gel method, and an MOD method. Thereafter, a photo etching is performed to form the source electrode 5 and the drain electrode 6.

In addition, a mask having a predetermined form may be used to form the source electrode 5 and the drain electrode 6 on the substrate 7 according to the aforementioned method.

When a polymer compound containing conductive particles such as fine metal particles and graphite is used, the electrodes can be formed easily and economically by performing solution patterning such as by an ink jet method.

Next, in a region on the substrate 7 between the source electrode 5 and the drain electrode 6, a recessed portion 8 whose bottom surface is located inside the substrate or on a substrate side is formed.

The method of forming the recessed portion 8 is not limited to a specific method. However, preferably, etching may be used. For example, by etching the substrate 7 with a mask covering the source electrode 5 and the drain electrode 6, a recessed portion 8 is formed between the source and the drain electrodes 5 and 6 of the substrate 7.

As the etching method, any known method by which the substrate 7 can be etched and the source and drain electrodes 5 and 6 are not influenced can be used. More specifically, wet etching using an acid such as hydrofluoric acid, nitric acid, hydrochloric acid, and sulfuric acid, wet etching using a base such as sodium hydroxide, potassium hydroxide, calcium hydroxide, and ammonia, wet etching using a aromatic type solvent, a ketone type solvent, an alcohol type solvent, or an organic solvent, or dry etching using oxygen plasma, argon plasma, or $CF_4$ plasma can be used.

According to this embodiment of the invention, preferably, dry etching which enables etching to be performed conveniently without using a chemical substance may be used, and, more preferably, etching using oxygen plasma having an additional effect of cleaning an electrode may be used. By using one of the aforementioned etching methods, the recessed portion 8 can be formed appropriately inside the substrate.

In addition, it is possible to use a resistor pattern which is used in patterning the source and the drain electrodes 5 and 6 as a mask, and an appropriate method can be used according to the material of the electrode, the substrate, and the etching method.

A2. Forming an Organic Semiconductor Layer on the source electrode 5, the drain electrode 6 and the substrate 7, an organic semiconductor layer 4 is formed so that a boundary surface between the semiconductor layer 4, which is in a region between the source electrode 5 and the drain electrode 6, and the gate insulating layer 3 is configured to be closer to a bottom side of the substrate 7 than boundary surfaces between the source and drain electrodes 5 and 6 and the substrate 7.

Before forming the organic semiconductor layer 4, the adherence of the semiconductor layer 4 can be improved by performing a pre-treatment described in the operation A1.

A predetermined organic semiconductor material can be formed on the source electrode 5, the drain electrode 6, and the substrate 7 by using a vacuum vapor deposition method, a spin coating method, a casting method, a pulling method, a Langmuir-Blodgett method, a spraying method, an ink jet method, a silk-screening method, or the like as a method of forming the organic semiconductor layer 4. Among the aforementioned methods, it is preferable that the ink jet method is used in the embodiment of the invention.

A condition for forming the organic semiconductor layer 4 can be configured on the basis of the method used so that the average thickness and position of the semiconductor layer 4 described above can be attained.

A3. Forming a Gate Insulating Layer

Next, a gate insulating layer 3 is formed on the organic semiconductor layer 4.

When the gate insulating layer 3 is formed of an inorganic material, the gate insulating layer 3, for example, may be formed by using a thermal oxidation method, a CVD method, and a SOG method. By adding polysilazane to the original material, it becomes possible to form a silica film or a silicon nitride film as the insulating layer 3 by using a wet process.

On the other hand, when the gate insulating layer 3 is formed of an organic material, the gate insulating layer 3 may be formed by coating the gate insulating layer 3 with a solution containing an organic material or a precursor thereof to cover the gate insulating layer 3 and performing post-treatment of the coated membrane (for example, heating, irradiation of infrared rays, irradiation of ultra-sonic waves). As a method of coating the gate insulating layer 3 with a solution containing an organic material or a precursor thereof, a coating method such as spin coating method and a deep coating method and a printing method such as an inkjet method and a screen method can be used. Among the methods, preferably, the spin coating method may be used according to an embodiment of the invention.

A4. Forming a Gate Electrode

Finally, the gate electrode 2 is formed on the gate insulating layer 3.

On the gate insulating layer 3, the gate electrode 2 can be formed with a predetermined electrode material by using the same method as described in an operation A1. Among the aforementioned methods, the ink jet method can be used in the embodiment of the invention.

By using the manufacturing method including the aforementioned processes, the circuit board 1 having the recessed portion 8 between the source and drain electrodes 5 and 6 of the substrate 7 can be acquired.

Second Embodiment

A circuit board 1 and a manufacturing method thereof according to a second embodiment of the invention will now be described with focusing on differences from the first embodiment, and description about common features is omitted.

(1) Circuit Board

Figure 2:
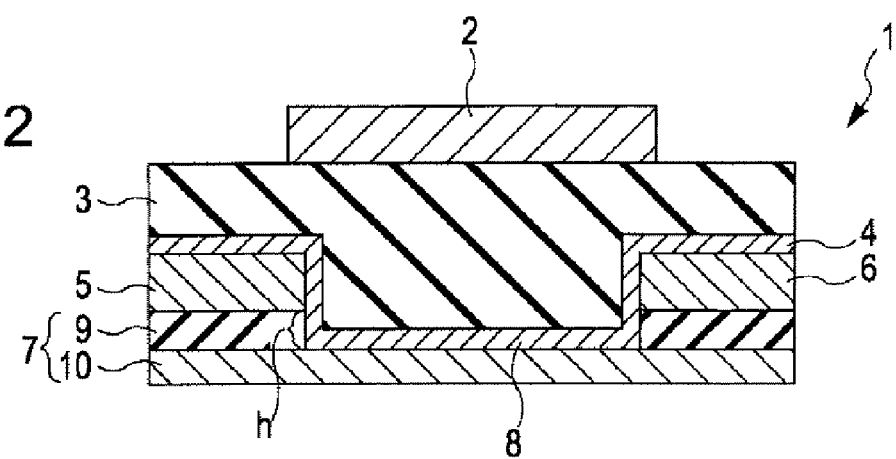
FIG. 2 is a schematic diagram of a circuit board according to a second embodiment of the invention.

FIG. 2 is a schematic longitudinal sectional view of a circuit board 1 according to another embodiment of the invention. Hereinafter, an upper side in FIG. 2 is referred to as up, and a lower side in FIG. 2 is referred to as down.

The circuit board 1 shown in FIG. 2 has a same structure as that of the circuit board 1 in the first embodiment except the existence of a base insulating layer 9.

In other words, there are differences in the second embodiment from the first embodiment that a base insulating layer 9 is formed and the whole part of the base insulating layer 9 disposed between the source electrode 5 and the drain electrode 6 is etched.

The base insulating layer 9 and a base body 10 construct the substrate 7 shown in FIG. 1. In other words, the substrate 7 includes the base body 10 and the base insulating layer 9. Accordingly, the base body 10 is formed of a same material as the material of the substrate 7 described in the first embodiment.

Here, the base insulating layer 9 is used for insulating an organic semiconductor layer 4, a source electrode 5, a drain electrode 6, or the base body 10. The base insulating layer 9 is disposed between the source and drain electrodes 5 and 6 and the base body 10 to contact the organic semiconductor layer 4. A bottom surface of a recessed portion 8 is disposed in a base body 10 side, and a portion of the organic semiconductor layer 4 located in a region between the source and the drain electrodes 5 and 6 is disposed inside the base insulating layer 9.

A material and a composition ratio of the material of the base insulating layer 9 are the same as the gate insulating layer 3 described above.

As a result of seriously considering the material of the base insulating layer 9 for further improvement of the mobility, it has been found that when a compound represented by a general formula 1 is used, the mobility is much increased.

[Chemical Formula 1]

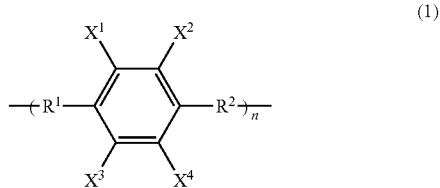

(1)

(where $R^1$ and $R^2$ each independently denote a substituted or unsubstituted alkylene group; $X^1$, $X^2$, $X^3$, and $X^4$ denote hydrogen or an electron withdrawing group, and n denotes a number in the range of 100 to 10000)

A mechanism of improvement of the mobility, although it is not definitely clear, is understood that the compound attracts electrons from the organic semiconductor layer 4 to improve the density of carriers in the organic semiconductor layer 4 and decrease in a carrier trap level of the organic semiconductor layer 4.

Here, $R^1$ and $R^2$ in the general chemical formula 1 each independently denote a substituted or unsubstituted alkylene group. Preferably, the alkylene group may have the number of carbons in the range of 1 to 20, more preferably, may have the number of carbons in the range of 1 to 10, and, even more preferably, may have the number of carbons in the range 1 to 4. To be more specific, the alkylene group may be a methylene group, an ethylene group, a propylene group, a penthylene group, a heptylene group, a nonylene group, or the like. Among the alkylene groups, the methylene group may be used preferably. Accordingly, a compound represented by the general formula 1 can be easily synthesized.

As a substituent to replace the alkylene group, an alkyl group having the number of carbons in the range of one to ten or a halogen atom such as a fluorine atom, a chlorine atom, a brome atom, and an iodine atom may be used. Among the substituents, it is preferable that a halogen atom is used for appropriately attracting electrons from the organic semiconductor layer 4. In the manner, the electrons from the organic semiconductor layer 4 can be attracted.

As the $X^1$, $X^2$, $X^3$, and $X^4$, hydrogen, a sulfone group, or a thiol group may be used. A combination of two or more aforementioned groups may be used. Among the groups, a halogen atom capable of attracting electrons from the organic semiconductor layer 4 is preferably, and a chlorine atom is more preferably used. Accordingly, since improvement of the carrier density and a decrease in the carrier trap level can be ensured, the mobility can be improved or the threshold voltage can be lowered.

Which one of $X^1$, $X^2$, $X^3$, and $X^4$ should be hydrogen or should be substituted with an electron withdrawing group is not particularly limited. As an example, when $R^1$ and $R^2$ are the same, and there are substitutions of one or three electron-withdrawing groups, any one or three of $X^1$ to $X^4$ may be substituted. When there are substitutions of two electron withdrawing groups, $X^1$ and $X^2$, $X^1$ and $X^3$, or $X^1$ and $X^4$ are substituted with electron withdrawing groups. On the other hand, when $R^1$ and $R^2$ are different groups and there is substitution of one electron withdrawing group, any one of $X^1$ to $X^4$ may be substituted, and when there are substitutions of two electron withdrawing groups, there is a case where $X^2$ and $X^4$ are additionally substituted with the electron withdrawing groups together with the combination for two substitutions described above. When there are three substitutions of the electron withdrawing groups, there is a case where $X^1$, $X^2$, and $X^3$ or $X^1$, $X^2$, and $X^4$ are substituted with the electron withdrawing groups.

In a point of view of ensuring for attracting electrons from the organic semiconductor layer 4, at least any two of $X^1$ to $X^4$ are preferably substituted with electron withdrawing groups, and all $X^1$, $X^2$, $X^3$ and $X^4$ are more preferably substituted with electron withdrawing groups. In this case, the improvement of the carrier density and decrease in a carrier trap level can be ensured, and accordingly the improvement of the mobility, the improvement of an on-off ratio, and a decrease in a threshold voltage can be achieved to realize the improvement of the durability of the device.

The compound represented by the general formula 1 which has an aforementioned structure may preferably have a number-average molecular weight in the range of 10000 to 1000000. When the number-average molecular weight is in the range described above, it becomes easy to synthesize the compound represented by the general chemical formula 1, and accordingly electrons can be attracted from the organic semiconductor layer 4 appropriately.

Specific examples of the compound represented by general chemical formula 1 containing combinations of $R^1$, $R^2$, $X^1$, $X^2$ r $X^3$ and $X^4$ described above are as follows:

[Chemical Furmula 2]

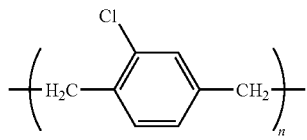
1

-continued

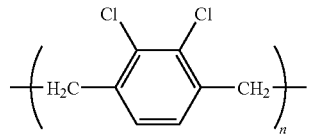
2

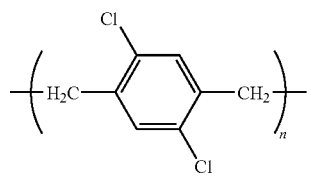
3

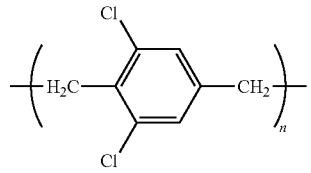
4

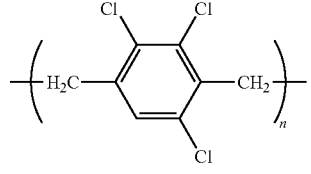
5

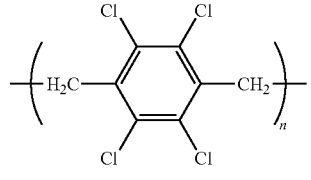
6

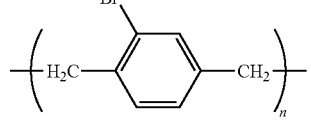
7

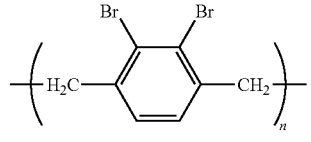
8

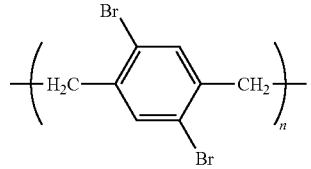
9

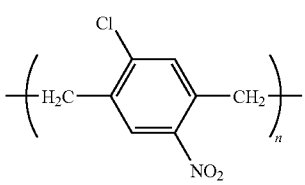
10

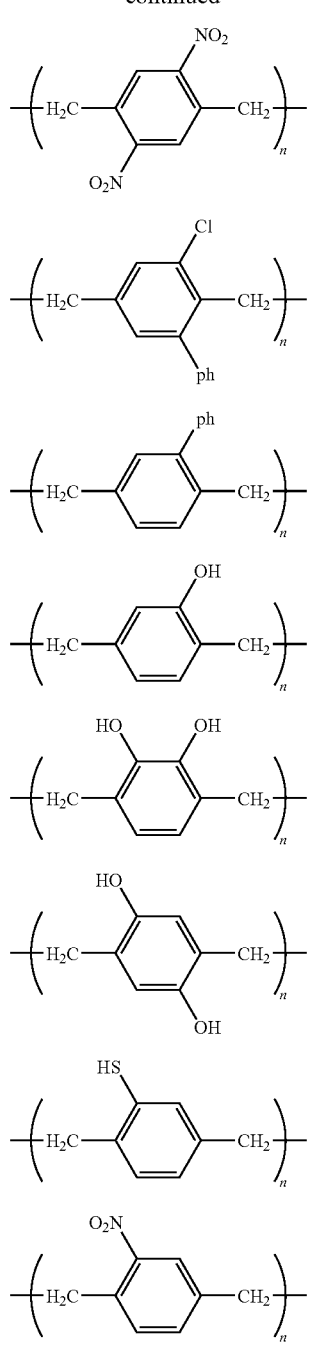

Among these compounds, in a point of view of ensuring for attracting electrons from the organic semiconductor layer 4, poly-dichloro-p-xylylene compounds 2, 3, and 4 and a poly-tetrachloro-p-xylylene compound 6 are preferably used. In the case, since electrons are attracted from the organic semiconductor layer 4, the improvement of the mobility, the improvement of the on-off ratio, and the decrease in the threshold voltage can be achieved.

The compound represented by the general chemical formula 1 may be contained in the gate insulating layer 3 and the base insulating layer 9. However, it is preferable that the compound represented by the general chemical formula 1 is contained at least in the base insulating layer 9. In the case, since electrons are attracted from the organic semiconductor layer 4, the improvement of the mobility and the like can be achieved, When the compounds are contained in both the gate insulating layer 3 and the base insulating layer 9, the compounds may be different from each other. By using different compounds, the intensity of the attraction force for the electrons from the organic semiconductor layer 4 can be controlled.

The average thickness of the base insulating layer 9 may preferably be in the range of 10 to 1000 nm, and, more preferably, in the range of 50 to 500 nm. When the average thickness is in the range described above, a recessed portion 8 can be formed assuredly.

(2) Method of Manufacturing Circuit Board

The circuit board 1 described above, as an example, can be manufactured by the following method.

The method of manufacturing the circuit board 1 shown in FIG. 2 includes forming a base insulating layer 9 on a base body 10 (B1) forming a source electrode 5 and a drain electrode 6 on the base insulating layer 9 together with forming a recessed portion 8 on the base insulating layer 9 (B2), forming an organic semiconductor layer 4 on the source electrode 5, the drain electrode 6, and the base body 10 (B3), forming a gate insulating layer 3 on the organic semiconductor layer 4 (B4), and forming a gate electrode 2 on the gate insulating layer 3 (B5).

B1. Forming a Base Insulating Layer

This operation is performed the same as the operation A3 in the first embodiment, but in the second embodiment of the invention, the plasma CVD method may be used preferably.

B2. Forming a Source Electrode and a Drain Electrode Together with a Recessed Portion This operation is the same as the operation A1 described in the first embodiment except that forming a source electrode 5 and a drain electrode 6 on a base insulating layer 9 and etching the whole region on the base insulating layer 9 between the source electrode 5 and the drain electrode 6. For efficient etching in this embodiment, the wet etching may be used preferably, and etching by using an acid such as hydrofluoric acid may be used more preferably. In addition, a recessed portion is formed on the base insulating layer 9, and the bottom of the recessed portion is disposed in a base body 10 side, that is, on a surface of the base body 10.

B3. Forming an Organic Semiconductor Layer

This operation is the same as the operation A2 described in the first embodiment. However, in the embodiment, the vacuum vapor deposition method may be used preferably.

B4. Forming a Gate Insulating Layer

This operation is the same as the operation A3 described in the first embodiment.

B5. Forming a Gate Electrode

This operation is the same as the operation A4 described in the first embodiment.

By using the manufacturing method including the operations described above, a circuit board 1 in which the whole region of the base insulating layer 9 between the source electrode 5 and the drain electrode 6 is etched can be acquired.

Third Embodiment

A circuit board 1 and a manufacturing method thereof according to a third embodiment of the invention will now be described with focusing on differences from the first and second embodiments and description about common features is omitted.

(1) Circuit Board

Figure 3:
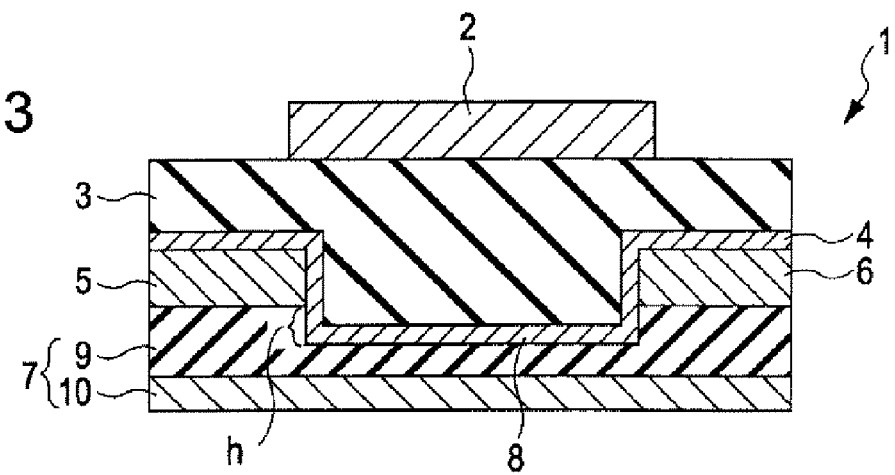
FIG. 3 is a schematic diagram of a circuit board according to a third embodiment of the invention.

FIG. 3 is a schematic longitudinal sectional view of a circuit board 1 according to another embodiment of the invention. Hereinafter, an upper side in FIG. 3 is referred to as up, and a lower side in FIG. 3 is referred to as down.

The circuit board 1 shown in FIG. 3 has the same structure as that of the circuit board 1 in the second embodiment except an etching status of a base insulating layer 9.

In other words, the circuit board 1 of the third embodiment has a difference from that of the second embodiment in that a part of a region of the base insulating layer 9 interposed between a source electrode 5 and a drain electrode 6 is etched.

(2) Method of Manufacturing Circuit Board

The circuit board 1 described above, as an example, can be manufactured by the following method.

The method of manufacturing the circuit board 1 shown in FIG. 3 includes forming a base insulating layer 9 on a base body 10 (C1), forming a source electrode 5 and a drain electrode 6 on the base insulating layer 9 together with forming a recessed portion 8 on the base insulating layer 9 (C2), forming an organic semiconductor layer 4 on the source electrode 5, the drain electrode 6, and the base insulating layer 9 (C3), forming a gate insulating layer 3 on the organic semiconductor layer 4 (C4), and forming a gate electrode 2 on the gate insulating layer 3 (C5).

C1. Forming a Base Insulating Layer

This operation is performed the same as the operation B1 in the second embodiment.

C2. Forming a Source Electrode and a Drain Electrode Together with a Recessed Portion This operation is the same as the operation A1 described in the first embodiment except that forming a source electrode 5 and a drain electrode 6 on a base insulating layer 9 and etching the whole region on the base insulating layer 9 between the source electrode 5 and the drain electrode 6. For efficient etching in the embodiment, the wet etching may be used preferably, and etching by using an acid such as hydrofluoric acid may be used more preferably. In addition, a recessed portion is formed on the base insulating layer 9, and the bottom of the recessed portion is disposed in a base body 10 side, that is, on a surface of the base body 10.

C3. Forming an Organic Semiconductor Layer

This operation is the same as the operation B3 described in the second embodiment.

C4. Forming a Gate Insulating Layer

This operation is the same as the operation B4 described in the second embodiment.

C5. Forming a Gate Electrode

This operation is the same as the operation B5 described in the second embodiment.

By using the manufacturing method including the operations described above, a circuit board 1 in which a part of a region of the base insulating layer 9 interposed between the source electrode 5 and the drain electrode 6 is etched can be acquired.

Other Embodiments

In the embodiments described above, a circuit board 1 of top-gate bottom-contact type is described with reference to the figures. However, a circuit board 1 according to an embodiment of the invention may further include a layer used for an arbitrary purpose between any two of the layers described above, and the structure of the circuit board 1 is not limited to a specific type such as the top-gate bottom-contact type and may be a bottom-gate type, a top-gate type, a top-contact type, a bottom-contact type, or the like. Accordingly, the circuit board may be used for various purposes including a transistor.

In addition, although the organic semiconductor layer 4 disposed in a region between the source electrode 5 and the drain electrode 6 is inside the substrate 7 or the base insulating layer 9 in the embodiments described above, the organic semiconductor layer 4 may be disposed inside both the substrate 7 and the base insulating layer 9. Moreover, based on a structure of the circuit board, the organic semiconductor layer 4 may be disposed inside the gate insulating layer 3. By using the structure described above, a boundary area between the gate insulating layer 3 and the organic semiconductor layer 4 in the region is increased to decrease an off-current. In addition, the reduction of an absolute value of a threshold voltage and the improvement of the mobility can be achieved.

In the embodiments described above, a boundary surface between the organic semiconductor layer 4 and the gate insulating layer 3 in a region between the source electrode 5 and the drain electrode 6 is disposed closer to the bottom surface of the substrate 7 than boundary surfaces between the source electrode 5 and the drain electrode 6 and the substrate 7, but typically the boundary surface between the organic semiconductor layer 4 and the gate insulating layer in the region may be configured to be closer to the bottom side of the substrate 7 than the boundary surface between the gate insulating layer 3 and the organic semiconductor layer 4 in other regions. By using the configuration described above, the boundary area between the gate insulating layer 3 and the organic semiconductor layer 4 is increased to be able to reduce the off-current. In addition, the reduction of an absolute value of a threshold voltage and the improvement of the mobility can be achieved.

In addition, in the embodiments described above, the recessed portion 8 is formed over almost all of the region which is interposed between the source electrode 5 and the drain electrode 6, but in a point of view of increasing the boundary area between the gate insulating layer 3 and the organic semiconductor layer 4, the recessed portion 8 may be formed in a part of the region described above. By forming the organic semiconductor layer as described above, the boundary area between the gate insulating layer 3 and the organic semiconductor layer 4 is increased to be able to reduce the off-current.

In a method of manufacturing the circuit board 1, any operation may be further included as long as the advantages of the invention can be acquired, and the order in the operations does not matter. And also, the source electrode 5 and the drain electrode 6 may be formed after the recessed portion 8 is formed on the substrate 7 or base insulating layer 9.

Electro-Optical Apparatus

Now, an electro-optical apparatus including a semiconductor apparatus according to an embodiment of the invention will be described Examples of the electro-optical apparatus according to an embodiment of the invention are a liquid crystal device including a liquid crystal display device, an organic EL device including an organic EL display device, an electrophoresis display device, and a printer head.

Now, an electro-optical device including a semiconductor device and a method thereof according to an embodiment of the invention will be described for an example of an electrophoresis display device with reference to figures.

(1) Electrophoresis Display Device

Figure 4:
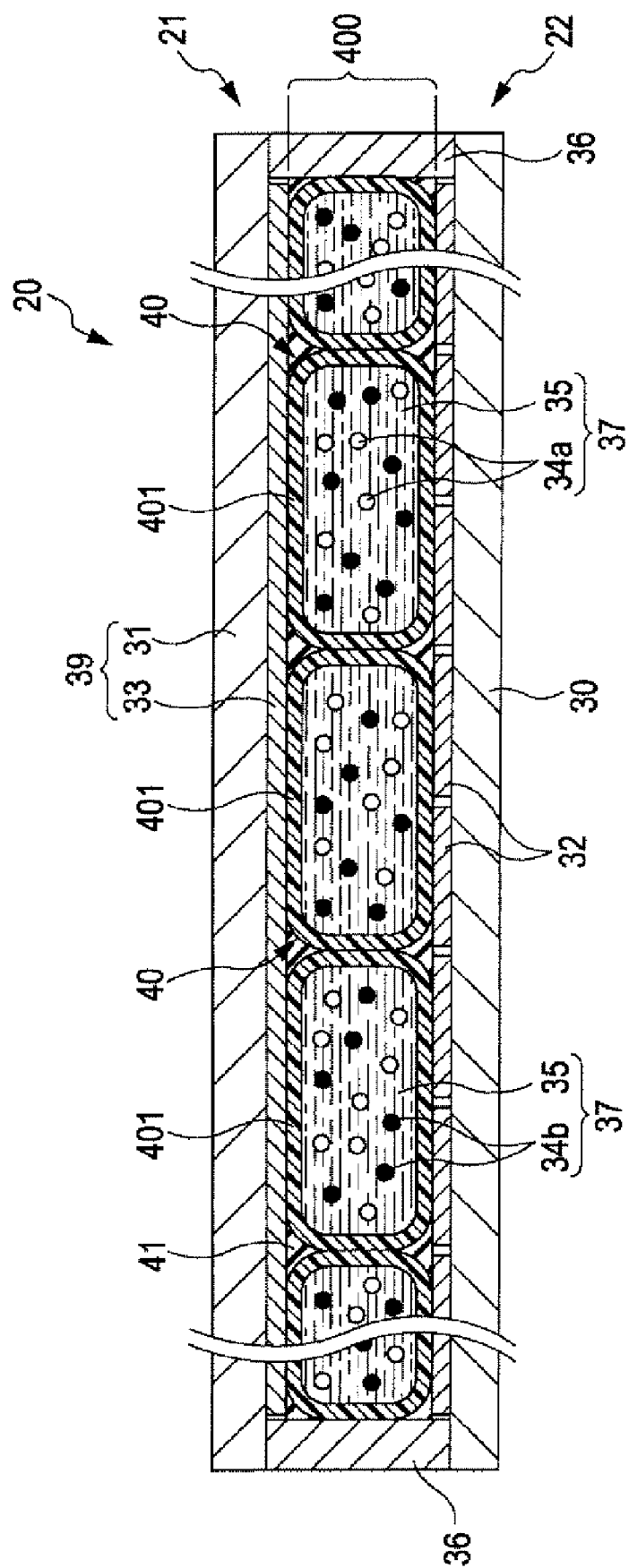
FIG. 4 is a schematic diagram showing an electrophoresis display device which is an electro-optical device according to an embodiment of the invention.
Figure 5:
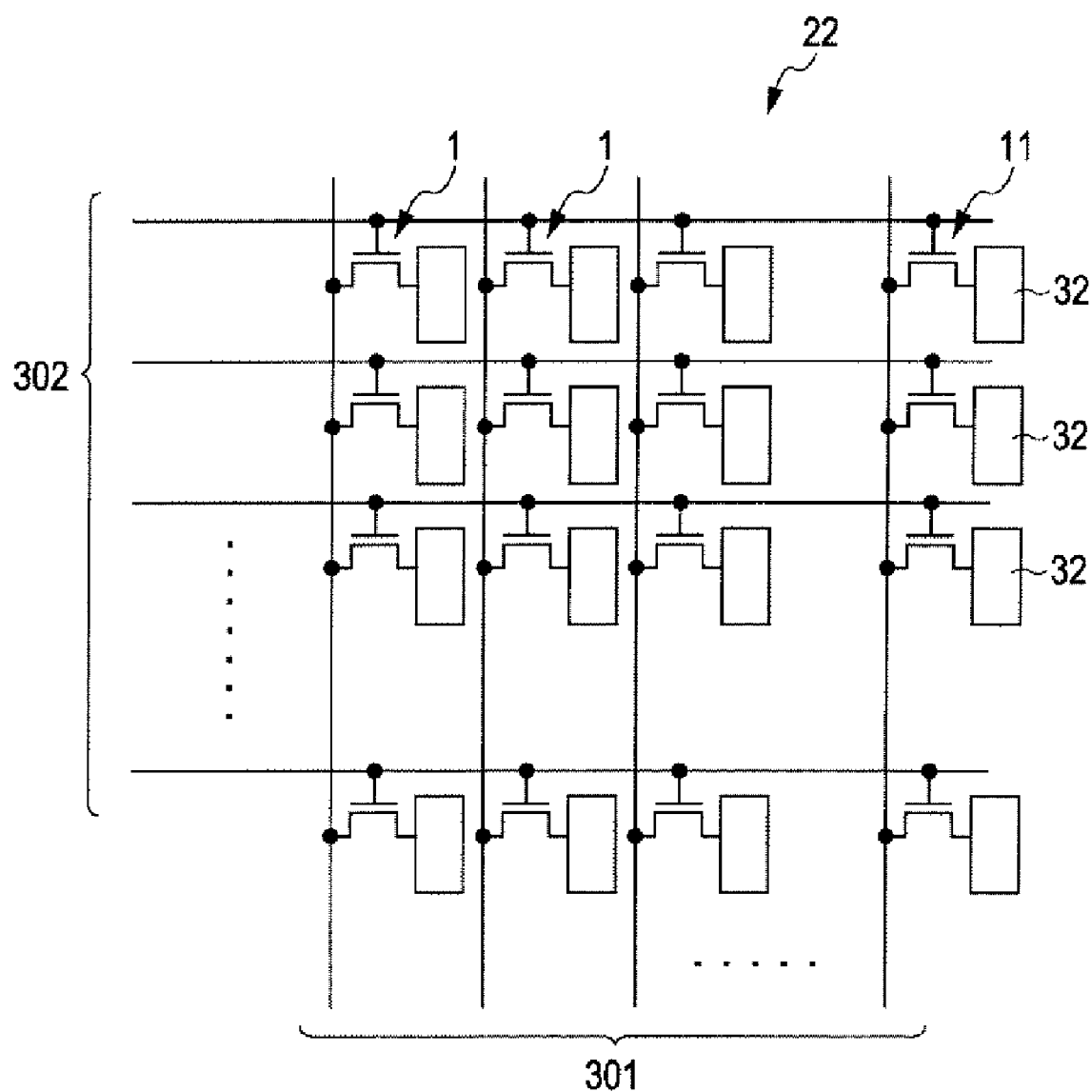
FIG. 5 is a block diagram showing a structure of an active matrix device.

FIG. 4 is a longitudinal sectional view of an electrophoresis display device according to an embodiment of the invention. FIG. 5 is a block diagram showing a structure of an active matrix device as an example of a circuit board 1 included in the electrophoresis display device.

Hereinafter, for the convenience of description, upper sides in FIGS. 4 and 5 are referred to as up, and lower sides in FIGS. 4 and 5 are referred to as down, respectively.

The electrophoresis display device 20 shown in FIG. 4 includes an electrophoresis display sheet (front plane) 21, an active matrix device (back plane) 22, and a sealing section 36 tightly sealing a gap between the electrophoresis display sheet 21 and the active matrix device 22.

The electrophoresis display sheet 21 includes a base section 31 having a flat plane shape, a substrate 31 including a second electrode 33 which is disposed below a bottom surface of the base section 31, and a microcapsule containing layer 400 which is disposed under a bottom surface (one side) of the substrate 39 and has microcapsules 40 and binding material 41.

The active matrix device 22 includes a base section 30 having a flat plane shape and a plurality of first electrodes 32 disposed on the base section 30.

As shown in FIG. 5, the active matrix device 22 includes a plurality of data lines 301 and a plurality of scan lines 302 which cross with each other at right angles and transistors 11 disposed around intersections between the data lines 301 and the scan lines 302, respectively.

Of each transistor 11, a gate electrode 2, a source electrode 5, and a drain electrode are connected to the scan line 302, the data line 301, and a pixel electrode (first electrode) 32 to be described later, respectively.

In each capsule 40, electrophoretic dispersion solution 37 including a plurality of types of electrophoretic particles having different properties, that is, two types of electrophoretic particles 34a and 34b having different charges and colors (color tones) in the embodiment, and a liquid-phase dispersion medium 35 is encapsulated.

Now, a structure of each section will be described.

The base sections 30 and 31 are formed of a sheet-shaped (flat plate shaped) members and have a function of supporting and protecting members interposed therebetween.

Each one of the base sections 30 and 31 may have flexibility or rigidity, but may preferably have rigidity. By using the base sections 30 and 31 having flexibility, the electrophoresis display device 20 having flexibility, that is, for example, the electrophoresis display device 20 which is useful to construct an electronic paper can be acquired.

When each of the base sections (base layers) 30 and 31 is to have flexibility, as the material of the base sections, as an example, polyolefin such as polyethylene, polypropylene, and a ethylene-vinyl acetate copolymer, liquid crystal polymer such as modified polyolefin, polyamide (for example, nylon 6, nylon 46, nylon 66, nylon 610, nylon 612, nylon 11, nylon 12, nylon 6-12, or nylon 6-66), thermoplastic polyimide, and aromatic polyester, a kind of thermoplastic elastomer such as polyphenylene oxide, polyphenylene sulfide, polycarbonate, polymethylmethacrylate, polyether, polyetheretherketone, polyetherimide, polyacetal, styrene system, polyolefin system, polyvinyl chloride system, polyurethane system, polyester system, polyamide system, polybutadiene system, transpolyisoprene system, fluoro-rubber system, and chlorinated polyethylene system, or a copolymer, a blended substance, a polymer alloy, or the like which mainly contains these materials may be used. Among the materials described above, one or a mixture of two or more may be used.

An average thickness of the base sections 30 and 31 is configured appropriately based on composition materials, usage, and the like and not limited to a specific range. However, when the base sections 30 and 31 are to have flexibility, the thickness of each of the base sections 30 and 31 may preferably be in the range of about 20 to 500 μm and more preferably be in the range of about 25 to 250 μm. By having the average thickness in the range described above, the electrophoresis display device 20 can have a balance between flexibility and rigidity and the miniaturization (especially, making thin) of the electrophoresis display device 20 can be achieved.

On each of the microcapsule 40 sides of the base sections 30 and 31, that is, on the base section 30 or under the base section 31, first and second electrodes 32 and 33 which form a shape of a layer, respectively are disposed.

When a voltage is applied between the first electrode 32 and the second electrode 33, an electric field is generated therebetween, and the electric field acts on the electrophoretic particles (display particles) 34a and 34b.

In the embodiment, the second electrode 33 becomes a common electrode, the first electrode 32 is configured to be an individual electrode (pixel electrode connected to a switching element) which is divided into a form of a matrix (form of line-column), and an overlapped part of the second electrode 33 and one first electrode 32 forms one pixel.

The second electrode 33 may be divided into a plurality of parts like the first electrode 32.

Alternatively, the first electrode 32 is divided into a stripe form, the second electrode 33 is divided into the same stripe form, and the first and second electrodes 32 and 33 may be arranged to cross with each other.

The material of each of the electrodes 32 and 33 is not limited to a specific material so long as the material have a conductivity. As an example, a metal material such as copper, aluminum, nickel, cobalt, platinum, gold, silver, molybdenum, and tantalum or alloyed metal containing these materials or the like, a carbon material such as carbon black, carbon nanotube, and fullerene, an electroconductive polymer such as polyacetylene, polypirrole, polythiophene, polyaniline, poly(p-phenylene), poly(p-phenylenevinylene), polyfluorene, polycarbazole, polysilane, and derivatives of these materials, an ion-conductive polymer in which an ionic material such as NaC, $LiClO_4$ KCl, $H_2O$, LiCl, LiBr, LiI, $LiNO_3$, LiSCN, $LiCF_3SO_3$, NaBr, NaI, NaSCN, $NaClO_4$, $NaCF_3SO_3$, KI, KSCN, $KClO_4$, $KCF_3SO_3$, $NH_4I$, $NH_4SCN$, $NH_4ClO_4$, $NH_4CF_3SO_3$, $MgCl_2$, $MgBr_2$, $MgI_2$, $Mg(NO_3)_2$, $MgSCN_2$, $Mg(CF_3SO_3)_2$, $ZnCl_2$, $ZnI_2$, $ZnSCN_2$, $Zn(ClO_4)_2$, $Zn(CF_3SO_3)_2$, $CuCl_2$, $CuI_2$, $CuSCN_2$, $Cu(ClO_4)_2$, and $Cu(CF_3SO_3)_2$ is dispersed in a matrix resin such as polyvinyl alcohol, polycarbonate, polyethylene oxide, polyvinyl butyral, polyvinyl carbazol, and vinyl acetate, or a conductive oxide material such as indium tin oxide (ITO), fluorine-doped tin oxide (FTO), tin oxide ($SnO_2$), and indium oxide (IO), may be used for each of the electrodes as a conductive material. Among the materials described above, one or a combination of two or more may be used.

Alternatively, as the material of each of the electrodes 32 and 33, as an example, a mixed material which is formed by mixing a conductive material (conductive particles) such as gold, silver, nickel, and carbon into a non-conductive material such as a glass material, a rubber material, and a polymer material to add a conductivity may be used.

As examples of the mixed material, there are a conductive rubber which is formed by mixing a conductive material into a rubber material, a conductive adhesive or a conductive paste which is formed by mixing a conductive material into an adhesive composition such as epoxy, urethane, and acryl, and a conductive resin which is formed by mixing a conductive resin into a matrix resin such as polyolefin, poly vinyl chloride, polystyrene, an ABS resin, nylon (polyamide), an ethylene vinyl acetate copolymer, polyester, an acrylic resin, an epoxy resin, and a urethane resin.

An average thickness of each of the electrodes 32 and 33 base sections 30 and 31 is configured appropriately based on composition materials, usage, and the like and not limited to a specific range. However, when the thickness of each of the electrodes 32 and 33 is preferably in the range of about 0.05 to 10 μm and is more preferably in the range of about 0.05 to 5 μm.

Among the base sections 30 and 31 and the electrodes 32 and 33, a base section and an electrode which are disposed on a display side have an optical transparency, that is, become to be substantially transparent (colorless transparent, colored transparent, or semi-transparent). By having the transparency, a state of the electrophoretic particles 34a and 34b in the electrophoretic dispersion solution 37 to be described below, that is, information (image) displayed on the electrophoresis display device 20, can be easily recognized by the eyes.

Each of the electrodes 32 and 33 may have a stacked multi-layer structure in which a plurality of materials are sequentially stacked other than a single layer including a group of a same material as described above. In other words, each of the electrodes 32 and 33, as an example, may have a single layer structure formed of ITO or a two-layer stacked structure in which an ITO layer and a polyanyline layer are stacked.

In the electrophoresis display sheet 21, the microcapsule containing layer 400 is disposed to contact a bottom surface of the second electrode.

In the microcapsule containing layer 400, a plurality of microcapsules 40 in which the electrophoretic dispersion solution 37 is encapsulated in capsule bodies is configured to be fixed by a binding material 41.

The microcapsule 40 is disposed in a single layer so that the microcapsule 40 can be aligned parallel in perpendicular and horizontal directions between the active matrix device 22 and the substrate 39.

In the embodiment, each microcapsule 40 is pinched by the first and second electrodes 32 and 33 to be compressed in upward/downward directions, and accordingly, each microcapsule 40 is expanded in a horizontal direction to be a flat shape. In other words, each microcapsule 40 forms a stone wall structure when viewed two-dimensionally.

In the electrophoresis display device 20 having the aforementioned structure, an effective display area increases to improve a contrast. In addition, since a moving distance of the electrophoretic particles 34a and 34b in the upward/downward directions can be shorten, the electrophoretic particles 34a and 34b can be moved and collected around a predetermined electrode in a short time, and accordingly, the improvement of a response speed can be achieved.

In this embodiment, one microcapsule 40 is disposed for two adjacent first electrodes 32. In other words, the microcapsule 40 is disposed to across two adjacent first electrodes 32.

As a material of the capsule body (shell body) 401, for example, gelatin, a mixed material of Arabic gum and gelatin, and a kind of resin materials such as urethane-based resin, melamine-based resin, urea resin, polyamide, and polyether can be used. Among the materials described above, one or a combination of two or more may be used.

In addition, a cross-linking agent may be added to the material of the capsule body 401 to form cross-links (three-dimensional cross-links). By adding the cross-linking agent, the strength of the capsule body 401 can be improved while the flexibility of the capsule body is maintained. Accordingly, the microcapsule 40 can be protected from being easily collapsed.

Each of the microcapsules 40 may be formed to have an almost uniform size preferably. By forming the microcapsules 40 to have an almost uniform size, the electrophoresis display device 20 can prevent or decrease the occurrence of uneven display to deliver superior display performance.

The electrophoresis dispersion solution 37 which is encapsulated in the capsule body 401 is formed by dispersing (suspending) at least one type of electrophoretic particles 34a and 34b (in the embodiment, electrophoretic particles 34a are colored particles and electrophoretic particles 34b are white particles) into a liquid phase dispersion medium.

As the electrophoretic particles 34a and 34b, any particles (charged particles) which are charged and can perform electrophoresis in the liquid-phase dispersion medium depending on an operation of an electric field can be used and is not limited to a specific type of particles, but at least one type of particles among pigment particles, resin particles, and mixed particles thereof are used appropriately. The aforementioned particles have advantages in that the particles can be produced easily and charging of the particles can be performed relatively easily.

As a pigment that forms the pigment particles, as an example, a black pigment such as aniline black, carbon black, and titanium black, a white pigment such as titanium oxide, antimony oxide, barium sulfate, zinc sulfate, zinc flower, silicon oxide, and aluminum oxide, an azole-based pigment such as monoazo, disazo, and polyazo, a yellow pigment such as insoindolinone, chromium yellow, yellow iron oxide, cadmium yellow, titanium yellow, and antimone, a red pigment such as quinacridone red and chromium vermilion, a blue pigment such as phthalocyanine blue, indanthrene blue, iron blue, ultramarine blue, and cobalt blue, and a green pigment such as phtalocyanine green may be used. Among the materials described above, one or a combination of two or more may be used.

As a resin material that forms the resin particles, as an example, an acryl-based resin, a urethane-based resin, a urea-based resin, an epoxy-based resin, polystyrene, and polyester may be used. Among the materials described above, one or a combination of two or more may be used.

As mixed particles, as an example, pigment particles of which surfaces are coated with a resin material or a different pigment, resin particles of which surfaces are coated with a pigment, particles including a mixture which is formed by mixing a pigment and a resin material at an appropriate composition ratio, or the like may be used.

As the pigment particles, surfaces of which are coated with a different pigment, as an example, titanium oxide particles, a surface of which is coated with silicon oxide or aluminum oxide may be used. The particles may be appropriately used as white particles 34b.

On the other hand, carbon black particles or carbon black particles, surfaces of which are coated may be appropriately used as the colored particles (black particles) 34a.

The shapes of the electrophoretic particles 34a and 34b are not limited to a specific shape. However, the electrophoretic particles 34a and 34b may have a shape of a sphere.

An average diameter of the electrophoretic particles 34a and 43b is preferably in the range of about 0.1 to 10 μm and is more preferably in the range of about 0.1 to 7.5 μm. By having the average diameter of the electrophoretic particles 34a and 43b in the range described above, cohesion among the electrophoretic particles 34a and 34b or precipitation in the liquid-phase dispersion medium 35 can be prevented assuredly, and accordingly, the deterioration of display quality of the electrophoresis display device 20 can be prevented appropriately.

As the liquid-phase dispersion medium 35, one that has low solubility in the capsule bodies 401 and a relatively high insulating property is used appropriately. The organic dispersion medium 35 is formed of non polar organic material (aprotic dispersion medium) which has a low polarity or does not have a polarity substantially.

As the liquid-phase dispersion medium 35, for example, a type of ester such as methyl acetate, ethyl acetate, butyl acetate, and formic ether, a type of ketone such as acetone, methylethylketone, diethylketone, methylisobutylketone, methylisoprophylketone, and cyclohexanone, a type of aliphatic hydrocarbon (liquid paraffin) such as pentane, hexane, and octane, a type of alicyclic hydrocarbon such as cyclohexane and methylcyclohexane, a type of aromatic hydrocarbon such as a type of benzene having long-chain alkyl group including benzene, toluene, xylene, hexyl benzene, heptyl benzene, octyl benzene, nonyl benzene, decyl benzene, undecyl benzene, dodecyl benzene, tridecyl benzene, and tetradecyl benzene, a type of halogenated hydrocarbon such as methylene chloride, chloroform, carbon tetrachloride, and 1,2-dichloroethane, a type of multi-ring aromatic compounds such as pyridine, pyrazine, furan, pyrrole, thiophene, and methylpyrrolidone, a type of nitrile such as acetonitrile, propionylnitrile, and acrylonitrile, a type of amide such as N,N-dimethylformamide and N,N-demethylacetamide, carboxylation, or a type of oil based material may be used. Among the materials described above, one or a mixture of two or more may be used.

Among the aforementioned materials, the liquid-phase dispersion medium 35 may mainly contain a type of benzene having a long-chain alkyl group preferably. The type of benzene having a long-chain alkyl group has a relatively high boiling point, and accordingly the volatility of the liquid-phase dispersion medium 35 at room temperature can be reduced. As a result, a change in the content ratio of the electrophoretic particles 34a and 34b or the water content ratio, for example, due to volatilization of the liquid-phase dispersion medium 35 in a process of manufacturing the electrophoresis dispersion solution 37 can be prevented. Accordingly, the deterioration of response characteristics or display performance of the electrophoresis display device 20 due to the change can be prevented assuredly.

In addition, in the liquid-phase dispersion medium 35, various dyes such as an anthraquinone dye, an indigoid dye, a triphenyl methane dye, a pyrazolone dye, a stilbene dye, a diphenyl methane dye, a xanthen dye, an alizarin dye, an acridine dye, quinonimine dye, a thiazole dye, a methine dye, a nitro dye, and a nitroso dye may be dissolved as needed.

The dispersion of the electrophoretic particles 34a and 35b into the liquid-phase dispersion medium 35 may be performed by using one method or a combination of two or more methods, as an example, among a paint shaker method, a ball-mill method, a media mill method, an ultrasonic dispersion method, and an agitation dispersion method.

It is preferable that a specific gravity of the electrophoretic particles 34a and 34b is configured to be almost the same as that of the liquid-phase dispersion medium 35. By the configuration of the specific gravity, the electrophoretic particles 34a and 34b can stay at fixed locations in the liquid-phase dispersion solution 35 even after application of a voltage between the electrodes 32 and 33 stops The binding materials 41 are supplied to bond the active matrix device 22 and the substrate 39 and fix the active matrix device 22, the substrate 39, and the microcapsules 40 and insulate between the electrodes 32 and 33. By using the binding materials 41, the durability and reliability of the electrophoresis display device 20 can be improved.

As the binding materials 41, a resin material having a superior affinity (adherence) to the electrodes 32 and 33 and the capsule bodies 401 (microcapsules 40) and a superior insulating property is used appropriately.

As the binding material 41, polyethylene, as an example, a thermoplastic resin such as polyethylene, chlorinated polyethylene, ethylene-vinyl acetate copolymer, ethylene-ethyl acrylate copolymer, polypropylene, an AS resin, an ABS resin, a methyl methaacrylate resin, a vinyl chloride resin, a vinyl chloride-vinyl acetate copolymer, a vinyl chloride-vinylidene copolymer, vinyl chloride acrylic ester copolymer, vinyl chloride-methacrylic acid copolymer, vinyl chrolide-acrylonitrile copolymer, ethylene-vinylalcohol-vinyl chloride copolymer, propylene-vinyl chloride copolymer, a vinylidene chloride resin, a vinyl acetate resin, polyvinylalcohol, polyvinyl formal, and cellulose-based resin, a polymer such as a polyamide-based resin, polyacetal, polycarbonate, polyethylene terephthalate, polybutylene terephthalate, polyphenylene oxide, polysulfone, polyamide-imide, polyaminobismaleimide, polyethersulfone, polyphenylene sulfone, polyarylate, grafted polyphenylene ether, polyetherether ketone, and polyetherimide, a fluorine-based resin such as polytetrafluoroethylene, polyfluoroethyleneprophylene, tetrafluoroethylene-ferfloroalcoxyethylene copolymer, ethylene-tetrafluoroethylene copolymer, polyfluorovinylidene, polytrifluorochloroethylene, and fluoro-rubber, a silicon-based resin such as a silicon resin and silicon rubber, a urethane-based resin such as polyurethane, and other resin materials such as methacrylic acid-styrene copolymer, polybuthylene, and methacrylic acid methyl-butadien-styrene copolymer may be used. Among the materials described above, one or a combination of two or more may be used.

The permittivity of the binding material 41 may be configured to be almost the same as that of the liquid-phase dispersion medium 35 preferably. For the configuration of the permittivity, it is preferable that a permittivity control agent such as alcohol, ketone, and carboxylation including 1,2-buthandiol and 1,4-buthandiol is added into the binding material 41.

Seal sections 36 are disposed between the base sections 30 and 31 along edges of the base sections 30 and 31. By the seal sections 36, each of the electrodes 32 and 33 and the microcapsule containing layer 400 are sealed air-tightly. Accordingly, penetration of moisture into the electrophoresis display device 20 is prevented, thereby preventing the deterioration of display performance of the electrophoresis display device 20 more assuredly.

As a material of the seal sections 36, as an example, a resin material including a thermoplastic resin such as an acryl-based resin, a urethane-based resin, and an olefin-based resin and a thermohardening resin such as an epoxy-based resin, a melamine-based resin, and a phenol-based resin may be used. Among the materials described above, one or a combination of two or more may be used.

The seal sections 36 are arranged as needed and may be omitted.

In the electrophoresis display device 20, when a selection signal (selection voltage) is supplied to one or a plurality of scan lines 302, one or more circuit boards 1 connected to the scan lines to which the selection signal (selection voltage) is supplied are turned on.

Accordingly, a data line 301 and a first electrode (pixel electrode) 32 which are connected to the circuit board 1 are electrically connected with each other, substantially. At this time, when a desired data (voltage) is supplied to the data line 301, the data (voltage) is supplied to the first electrode (pixel electrode) 32.

Accordingly, an electric field is generated between the first electrode (pixel electrode) 32 and a second electrode 33, and based on the direction and intensity of the electric field and characteristics of the electrophoretic particles 34a and 34b, the electrophoretic particles 34a and 34b move toward an electrode electrophoretically.

Thereafter, when the supply of the selection signal (selection voltage) to the scan line 302 stops, the circuit board 1 is turned off, and the data line 301 and the first electrode (pixel electrode) 32 which are connected to the circuit board become in a electrically disconnected status.

Accordingly, by an appropriate combination of supplying and stopping to supply the selection signal to the scan lines 302 and supplying and stopping to supply data to the data lines 301, a desired image (information) can be displayed on the on the electrophoresis display sheet 21 side of the electrophoresis display device 20.

In the electrophoresis display device 20 according to the embodiment, the electrophoretic particles 34a and 34b have different colors, and accordingly, an image having a multi-gradations can be displayed.

Since the electrophoresis display device 20 according to the embodiment has the active matrix device 22, a circuit board 1 which is connected to a specific scan line 302 can be turned on/off selectively. As a result, it is difficult to occur a problem of crosstalk, and it is possible to increase the operating speed of the circuit, and accordingly, an image (information) having a high quality can be acquired.

In addition, since the electrophoresis display device 20 according to the embodiment can operate under a low driving voltage, electric power can be saved.

A method of manufacturing the electrophoresis display device described above is not limited to a specific method so long as the method includes a method of manufacturing the circuit board according to an embodiment of the invention. In the method, any known method can be used. For example, the electrophoresis display device may be manufactured by using the following method.

(2) Method of Manufacturing Electrophoresis Display Device

FIGS. 6A to 6F are schematic diagrams for describing a method of manufacturing the electrophoresis display device shown in FIG. 4. Hereinafter, upper sides in FIGS. 6A to 6F are referred to as up, and lower sides in FIGS. 6A to 6F are referred to as down, respectively.

C1. Manufacturing Microcapsule

First, a microcapsule 40 in which electrophoretic dispersion solution 37 is sealed is manufactured.

A manufacturing method (method of sealing the electrophoretic dispersion solution 37 in a capsule body 401) of the microcapsule 40 is not limited to a specific method, but, as an example, one of various methods of microcapsulation such as an interfacial polymerization method, an IN-situ polymerization method, a phase separation method, an interfacial-precipitation method, and a spray dry method may be used.

The microcapsules 40 having a uniform size can be acquired, for example, by using a screening and selecting method, a filtering method, a mechanical separation method using a difference of specific gravities, or the like.

An average particle diameter of the microcapsules 40 is preferably in the range of about 20 to 200 µm, and is more preferably in the range of about 30 to 100 µm. By having the average particle diameter of the microcapsules 40 in the range described above, the electrophoresis of the electrophoretic particles 34a and 34b in the electrophoresis display device 20 can be controlled more assuredly.

C2. Method of Manufacturing Microcapsule Dispersion Solution

Next, microcapsule dispersion solution including the microcapsules 40 manufactured as described above, a binding material 41, and a dispersion medium is manufactured.

As the disperse medium, a solvent (aqueous solvent) that has a high hydrophilicity (that is, low hydrophobicity) may be used preferably. As the aqueous solvent, water such as distilled water and purified water, a lower alcohol such as methanol, ethanol, isopropanol, and butanol may be used, and among the aqueous solvents, the water may be used preferably. The lower alcohol may have a substituent having a low hydrophobicity such as a methoxy group. By using the aqueous solvent, the penetration of the solvent into the microcapsules 40 is suppressed, and accordingly, the swelling or dissolution of the mirocapsules 40 can be prevented more assuredly.

The concentration (content) of a binding material 41 in the microcapsule dispersion solution except the microcapsules 40 may be equal to or smaller than 50 wt % preferably, and in the range of about 0.05 to 25 wt % more preferably.

By configuring the concentration of the binding material 41 in the range described above, the viscosity of the microcapsule dispersion solution can be an appropriate value, and in a process of supplying the microcapsule dispersion solution so as to fill the gaps among the microcapsules 40 to be described below, it is possible to move the microcapsules 40 easily and surely.

The viscosity of the microcapsule dispersion solution is preferably in the range of about 1 to 1000 cP (25° C.), and is more preferably in the range of about 2 to 700 cP (25° C.).

The content of the microcapsules 40 in the microcapsule dispersion solution is preferably in the range of 10 to 80 wt %, and is more preferably in the range of 30 to 60 wt %.

When the content of the microcapsules 40 is configured to be in the range described above, there is an advantage that the microcapsules 400 are moved (rearranged) to be disposed in the microcapsule containing layer 400 so as not to be over-lapped with each other (as a single layer) in a thickness direction.

C3. Forming Microcapsule Containing Layer

Figure 6A:
FIGS. 6A to 6F are schematic diagrams showing a method of manufacturing the electrophoresis display device shown in FIG. 4.

Next, a substrate 39 as shown in FIG. 6A is prepared.

Figure 6B:
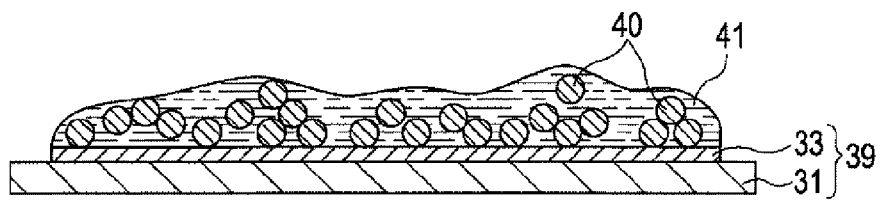

As shown FIG. 6B, microcapsule dispersion solution is supplied on the substrate 39.

As a method of supplying the microcapsule dispersion solution, for example, one of various coating methods such as a spin coating method, a deep coating methods and a spray coating method may be used.

Next, the microcapsule dispersion solution is evenly arranged on each section of the substrate 39 to have a uniform thickness (amount) as needed. The microcapsule dispersion solution may be evenly arranged for the microcapsules 40 to be disposed one by one (a single layer) without overlapping in a thickness direction preferably.

Figure 6C:
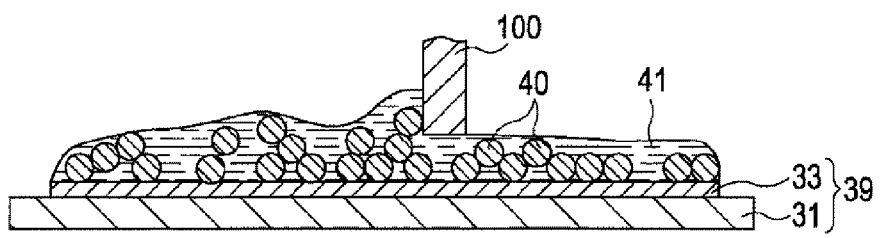

As shown in FIG. 6C, as an example, the evenly arrangement can be performed by passing a squeegee (jig having a shape of a flat panel) 100 above the substrate 39 to sweep the microcapsules 40.

Figure 6D:
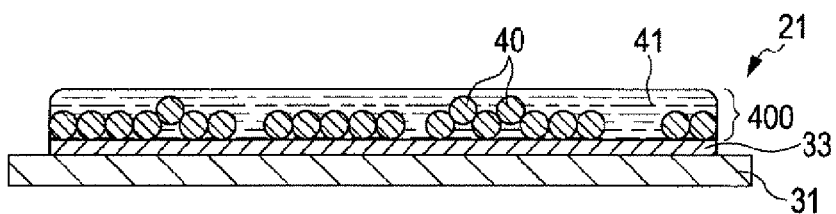

As a result, the microcapsule containing layer 400 is formed, and accordingly, the electrophoresis display sheet 21 as shown in FIG. 6D is acquired.

C4. Process of Bonding Active Matrix Device

Figure 6E:
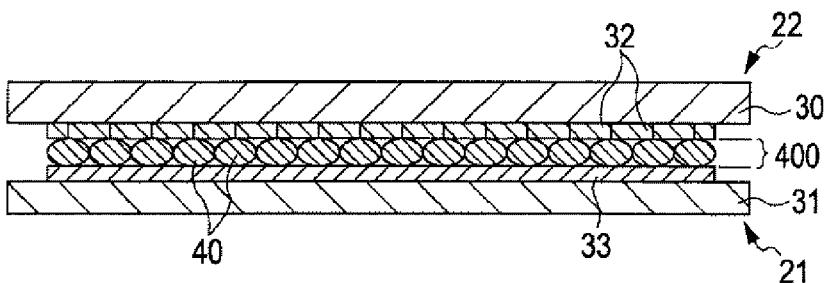

As shown in FIG. 6E, an active matrix device 22 which is a circuit board 1 manufactured by using the method of manufacturing a circuit board 1 according to an embodiment of the invention is overlapped and adjusted on the microcapsule containing layer 400 so that a first electrode 32 contacts the microcapsule containing layer 400.

As a result, the electrophoresis display sheet 21 and the active matrix device 22 are bonded to each other through the microcapsule containing layer 400.

C5. Process of Sealing

Figure 6F:
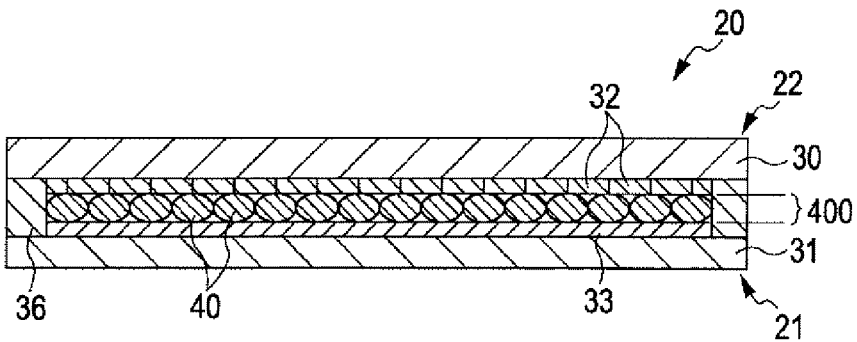

Next, as shown in FIG. 6F, the sealing sections 36 are formed along edges of the electrophoresis display sheet 21 and the active matrix device 22.

The sealing sections 36 can be formed by supplying a material for forming the sealing sections 36 into a space between the electrophoresis display sheet 21 (base section 31) and the active matrix device 22 (base section 30) along the edges thereof, for example, through a dispenser or the like and solidifying or hardening the material.

Through the processes described above, the electrophoresis display device 20 is acquired.

Electronic Apparatus

Next, an electronic apparatus including a circuit board according to an aspect of the invention will be described.

Examples of the electronic apparatus according to an aspect of the invention are a personal computer (mobile type personal computer), a mobile phone, a digital still camera, a television set, a video camera, a view finder type or monitor direct-view type video tape recorder, a laptop personal computer, a car navigation apparatus, a pager, an electronic pocket book (including one having a communication function), an electronic dictionary, a calculator, an electronic game device, a word processor, a workstation, a video phone, a TV monitor for security, a security TV monitor, an electronic binocular, a POS terminal, a device having a touch panel (for example, an automated cash dispenser of a banking facility and an automatic ticketing machine), a clinical instrument (for example, an electronic thermometer, a blood pressure meter, a blood glucose meter, a electrocardiography display apparatus, an ultrasonic diagnostic equipment, an endoscope display device), a fish-detector, various measuring devices/gauges (for example, gauges of a vehicle, an airplane, and a ship), a flight simulator, and other projection type display devices such as a monitor and a projector.

(1) Electronic Paper

Figure 7:
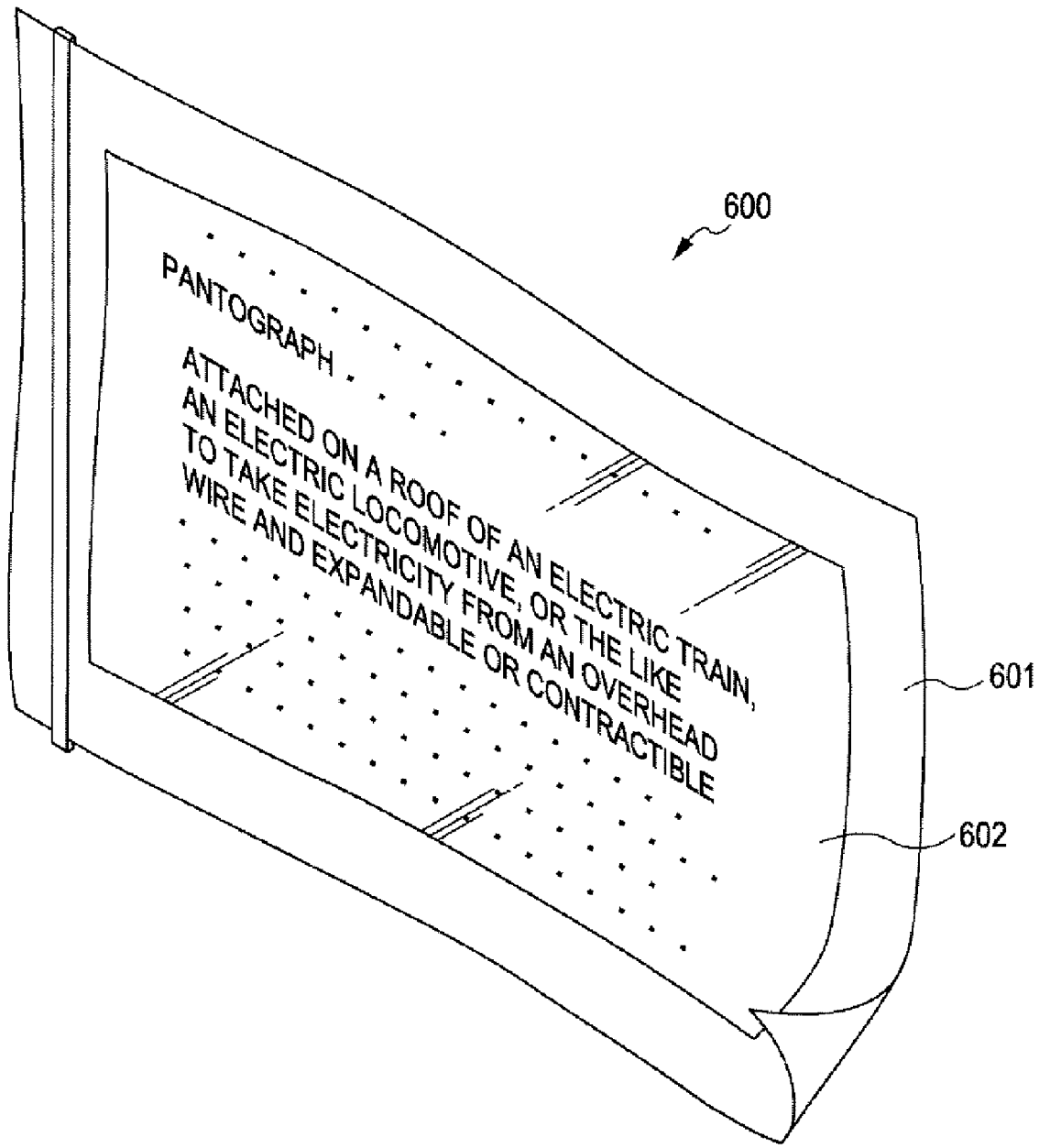
FIG. 7 is a schematic diagram showing an electronic paper which is an electronic apparatus according to an embodiment of the invention.

FIG. 7 is a perspective view showing an electronic paper which is an electronic apparatus according to an embodiment of the invention.

The electronic paper 600 shown in the figure has a main body 601 including a rewritable sheet having texture of paper and flexibility and a display unit 602.

In the electronic paper 600, the display unit 602 includes the electrophoresis display device 20 described above.

A method of manufacturing the electronic paper is not limited to a specific method so long as the method includes a method of manufacturing a circuit board according to an embodiment of the invention or a method of manufacturing an electronic optical device including a method of manufacturing a circuit board according to an embodiment of the invention, and in the method, any known method may be used.

(2) Display Device

Figure 8A:
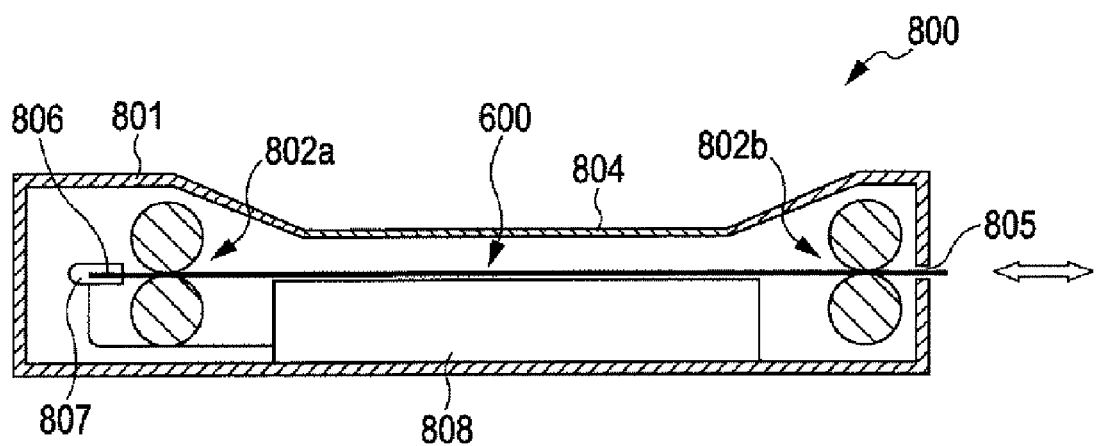
FIGS. 8A and 8B are schematic diagrams of a display device which is an electronic apparatus according to an embodiment of the invention.
Figure 8B:
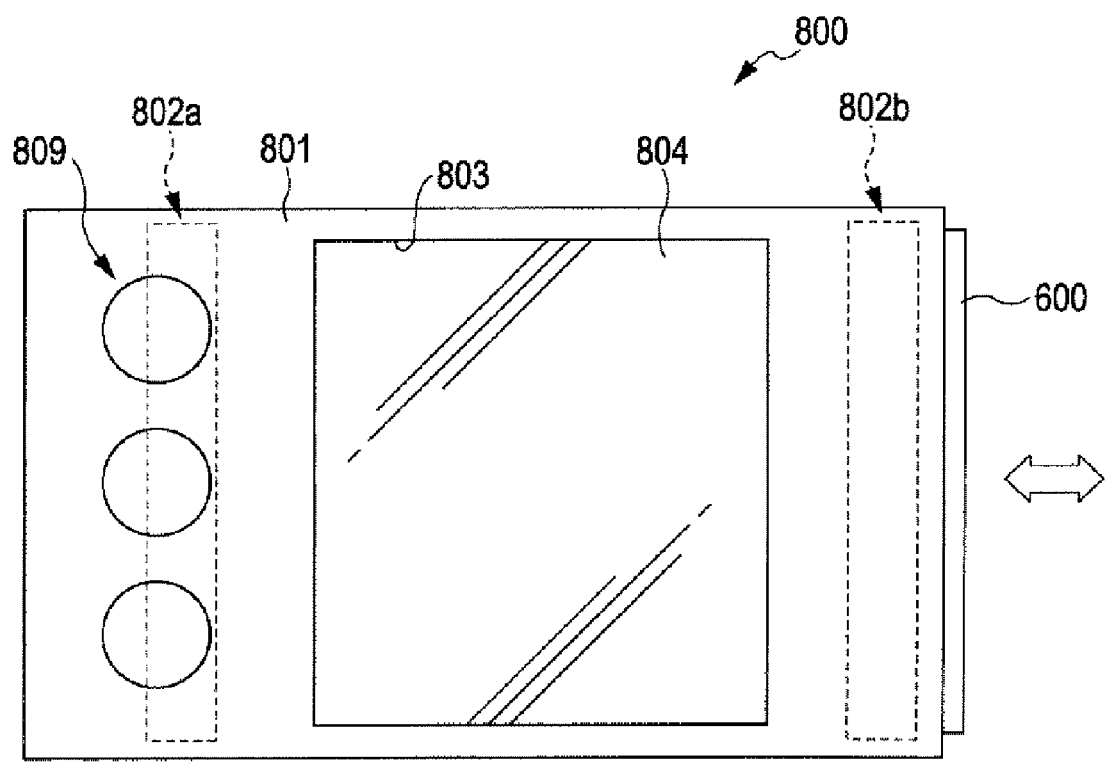

FIGS. 8A and 8B are diagrams showing a display device which is an electronic apparatus according to an embodiment of the invention. FIG. 8A is a sectional view of the display device, and FIG. 5B is a plan view of the display device.

The display device 800 shown in the figures includes a main body 801 and an electronic paper 600 that is arranged to be attachable/detachable to/from the main body 801. The electronic paper 600 has a same structure as described above, that is, the structure shown in FIG. 7.

In the main body 301, an insertion slot 305 into which an electronic paper 600 can be inserted is formed on a side (right side in the figure), and two sets of a couple of transport rollers 802*a* and 802*b* are disposed inside. When the electronic paper 600 is inserted into the main body 801 through the insertion slot 805, the electronic paper is installed in the main body with being pinched by the couples of the transport rollers 802*a* and 802*b*.

On a display side (front side of FIG. 8B) of the main body 80S, an opening section 803 having a rectangular shape is formed, and in the opening section 803, a transparent glass plate 804 is inserted. Accordingly, the electronic paper 600 installed in the main body 801 can be visible from an outside of the main body. In other words, in the display device 800, the electronic paper 600 installed in the main body 801 is configured to be visible through the transparent glass plate 804 to form a display surface.

In a front end portion (left side in the figure) of the electronic paper 600 in a inserting direction, a terminal section 806 is arranged, and inside the main body 801, a socket to which the terminal section 806 is connected with the electronic paper 600 being installed to the main body 801 is disposed. In the socket 807, a controller 808 and an operation section 809 are electrically connected.

In the display device 800, the electronic paper 600 which can be attachable/detachable to/from the main body 801 is installed in the main body 801, and accordingly, the display device 800 may be detached from the main body 801 to be carried and used.

In the display device 800, the electronic paper 600 includes the electrophoresis display device 20 described above.

It is preferable that the display device 800 in which the circuit board 1 according to an embodiment of the invention is used as the active matrix device is used, since an aperture ratio of the display device can be improved.

A method of manufacturing the display device 800 is not limited to a specific method so long as the method includes a method of manufacturing a circuit board according to an embodiment of the invention or a method of manufacturing an electro-optical device including a method of manufacturing a circuit board according to an embodiment of the invention, and in the method, any known method may be used.

A circuit board and a manufacturing method thereof according to an embodiment of the invention and an electro-optical device and an electronic apparatus including the circuit board are described above, but the invention is not limited to thereto.

EXAMPLES

1. Manufacturing a Thin-Film Transistor

Example 1

(1). Forming a Source Electrode and a Drain Electrode

Ultrasonic cleaning for a polyethylenenaphthalate substrate (made by Teijin DuPont Films; Teonex Q65®) was performed for thirty minutes using an isoprophyl alcohol solvent to degrease a surface.

Next, Cr was vacuum-vaporized on the substrate to have a thickness of 10 nm (1×10-4 Pa), and then Au was vacuum-vaporized to have a thickness of 100 nm. By performing Au and Cr etching for the Au/Cr film using a photo resistor TSMR8900 (made by Tokyo Ohka Kogyo, Co, Ltd.) to be patterned to have a shape of the source and drain electrodes having a channel length of 5 μm, a channel width of 200 μm, and an average film thickness of 100 nm, and a resist was removed by using a resist peeling solution.

(2). Forming a Recessed Portion

Next, oxygen plasma treatment for a region between the source and the drain electrodes of the substrate using a plasma treatment device in which RF power was set to 200 Watts and oxygen flow is set to 100 sccm was performed for two minutes. After the oxygen plasma treatment, an etching depth of a region between the source electrode and the drain electrode was measured using a contact-type level difference meter, and it was found that a depth of 40 nm is etched.

(3). Forming a Semiconductor Layer

A patterning coating for a region corresponding to a channel region was performed by an ink-jet device using 0.5 wt % toluene solution containing poly-9,9-dioctylfluoren-co-dithiophen (F8T2). Then, drying was performed under vacuum at 60° C. for ten minutes by a vacuum dryer to form an organic semiconductor layer having a thickness of 100 nm.

Since the thickness of the organic semiconductor layer is 100 nm, a boundary surface between the organic semiconductor layer and the gate insulating layer is located at an upper position than a boundary surface between the source and drain electrodes and the substrate.

(4). Forming Gate Insulating Layer

On the organic semiconductor layer, 10 wt % acetate butyl solution containing polymethylmetaacrylrate (PMMA) was coated by using a spin coating method (2400 rpm) and dried at 60° C. for ten minutes. Accordingly, a gate insulating layer of PMMA having a thickness of 1000 nm was formed on the recessed portion.

(5). Forming a Gate Electrode

After gold particle-dispersion solution (made by Shinku Yakin Co., Ltd. under a brand name "Perfect Gold") in which gold particles of 10 nm in diameter were dispersed in toluene was coated by an ink jet method and dried at 80° C. for ten minutes to form a gate electrode having a width of 10 μm and a thickness of 1 μm.

By the processes described above, a top-gate/bottom-contact type thin film transistor having a recessed portion in a region between the source and drain electrodes of the substrate was acquired.

Example 2

Same processes as the embodiment 1 were performed except that the oxygen plasma treatment was performed for five minutes and the etching depth between the source electrode and the drain electrode was set to be 100 nm in the operation (2) of the embodiment 1 to acquire a top-gate/bottom-contact type thin film transistor. Since the thickness of the organic semiconductor layer was 100 nm, a boundary surface between the organic semiconductor layer and the gate insulating layer had a same height as that of a boundary surface between the source and drain electrodes and the substrate.

Example 3

Same processes as the embodiment 1 were performed except that the oxygen plasma treatment was performed for ten minutes and the etching depth between the source electrode and the drain electrode was set to be 200 nm in the operation (2) of the embodiment 1 to acquire a top-gate/bottom-contact type thin film transistor. Since the thickness of the organic semiconductor layer is 100 nm, a boundary surface between the organic semiconductor layer is located in a lower position than a boundary surface between the source and drain electrodes and the substrate.

Example 4

(1). Forming a Base Insulating Layer

On a substrate on which degreasing operation the same as the operation (1) in the embodiment 1 was performed, a $SiO_2$ film having a thickness of 120 nm was formed by using a plasma CVD method.

(2). Forming a Source Electrode and a Drain Electrode

The source electrode and the drain electrode were formed by using the same method as the embodiment 1 except that the source and the drain electrodes are formed on the base insulating layer.

(3). Forming a Recessed Portion

The acquired substrate is etched for three minutes at 25° C. using 1% hydrofluoric acid to completely remove a $SiO_2$ film of a part which was not covered by the source and drain electrodes only, and accordingly, a level difference of 120 nm from the region between the source and drain electrodes was formed.

(4). Forming a Semiconductor Layer

On the substrate, a pentacene which had been purified by sublimation was vacuum-vaporized (1×10-4 Pa) to form an organic semiconductor layer having a thickness of 50 nm. Since the thickness of the organic semiconductor layer is 50 nm, a boundary surface between the organic semiconductor layer was located in a lower position than a boundary surface between the source and drain electrodes and the substrate.

(5). Forming a Gate Insulating Layer

A gate insulating layer was formed by using the same process as the embodiment 1.

(6). Forming a Gate Electrode

A gate electrode was formed by using the same process as the embodiment 1.

By the processes described above, a top-gate/bottom-contact type thin film transistor having a recessed portion in a region between the source and drain electrodes of the base insulating substrate.

Example 5

The same processes as the embodiment 4 were performed except that etching was performed for ten seconds at 25° C. to partly remove the SiO2 film of a part which was not covered by the source electrode and the drain electrode to make a level difference of 20 nm from the region between the source electrode and the drain electrode, and accordingly, a top-gate/bottom-contact type thin film transistor was acquired. Since the thickness of the organic semiconductor layer is 50 nm, a boundary surface between the organic semiconductor layer is located in an upper position than a boundary surface between the source and drain electrodes and the substrate.

Example 6

The substrate on which degreasing was performed in an operation (1) of the embodiment 4 was configured to a poly-p-xylillene film forming apparatus to form a film. In other words, dichloro-p-xylene dimer was led into a vaporization furnace which was set to a lowered pressure (1 Torr) and to a temperature of 180° C. to be heated and evaporated. Next, the evaporated compound was passed through a separation furnace which was set to 0.5 Torr and heated to 650° C. to be thermally decomposed to generate a radical monomer. Then the generated radical monomer was led into a vapor deposition room which was set to 0.05 Torr and a room temperature (25° C.) and deposited on a substrate configured in the vapor deposition room for ten minutes to form a base insulating layer of a 120 nm thickness including poly-(dichloro)-p-xylilene.

The same processes as the embodiment 4 were performed after the formation of the base insulating layer, and accordingly, a top-gate/bottom-contact type thin film transistor was acquired.

Example 7

(1). Forming Base Insulating Layer

The same process as the embodiment 6 was performed to form a base insulating layer of a 120 nm thickness including poly-(dichloro)-p-xylilene.

(2). Forming a Source Electrode and a Drain Electrode

The same process as the operation (2) of the embodiment 4 was performed to form the source electrode and the drain electrode.

(3). Forming a Recessed Portion

The same process as the embodiment 5 was performed to form a level difference of 60 nm from the region between the source and drain electrodes.

(4). Forming Semiconductor Layer

The same process as the operation (4) of the embodiment 4 was performed to form an organic semiconductor layer having a thickness of 50 nm. Since the thickness of the organic semiconductor layer is 50 nm, a boundary surface between the organic semiconductor layer is located in a lower position than a boundary surface between the source and drain electrodes and the base insulating layer.

(5). Forming a Gate Insulating Layer

The same process as the embodiment 6 was performed to form a gate insulating layer of a 120 nm thickness including poly-(dichloro)-p-xylilene.

(6). Forming a Gate Electrode

The same process as the operation (6) of the embodiment 4 was performed to form a gate electrode.

By the processes described above, a top-gate/bottom-contact type thin film transistor having a recessed portion in a region between the source and drain electrodes of the base insulating substrate was acquired.

Comparative Example

The same processes as the embodiment 1 except that formation of the recessed portion of the operation (2) in the embodiment 1 was not performed, and accordingly, a top-gate/bottom-contact type thin film transistor was acquired.

2. Evaluation

To acquire the characteristics of the thin film transistor acquired from the embodiments described above, a drain voltage of −40 volts was applied by using a semiconductor parameter analyzer ("4156C" made by Agilent Technology Co, Ltd.), and a drain current was measured when the gate voltage was swept from +10 Volts to −40 Volts. The result was represented in Table 1 and FIG. 9. Items in Table 1 were acquired by methods described below.

(1) Off Current

From a relationship (FIG. 9) between the acquired gate voltage and the drain current, a current in a case where the gate voltage was 0 Volt was acquired.

(2) On-Off Ratio

The on-off ratio is acquired from a ratio of drain currents in cases where the gate voltages are 0 Volt.

(3) Mobility and Threshold Voltage

A threshold voltage was acquired from an intercept of a straight line of the graph in which ½ power of the drain current was taken as a vertical axis and the gate voltage was taken as a horizontal axis, and a mobility of the transistor in a saturation region was acquired from an inclination of the straight line.

TABLE 1

| | Gate insulating layer | Base Insulating Layer | Recessed Portion (nm) | Organic Semiconductor Layer (nm) | Off Current (A) | On-Off Ratio | Mobility (cm$^2$/Vs) | Threshold Voltage (V) |
|---|---|---|---|---|---|---|---|---|
| Example 1 | PMMA | None | 40 | 100 | $3 \times 10^{-12}$ | $1 \times 10^7$ | $1 \times 10^{-3}$ | −5 |
| Example 2 | PMMA | None | 100 | 100 | $4 \times 10^{-13}$ | $3 \times 10^7$ | $4 \times 10^{-3}$ | −2 |
| Example 3 | PMMA | None | 200 | 100 | $2 \times 10^{-13}$ | $2 \times 10^7$ | $2 \times 10^{-3}$ | −3 |
| Example 4 | PMMA | SiO$_2$ | 120 | 50 | $1 \times 10^{-12}$ | $8 \times 10^5$ | 1.2 | −5 |
| Example 5 | PMMA | SiO$_2$ | 20 | 50 | $3 \times 10^{-12}$ | $1 \times 10^5$ | 1.0 | −6 |
| Example 6 | PMMA | poly-(dichloro)-p-xylylene | 120 | 50 | $3 \times 10^{-12}$ | $2 \times 10^5$ | 1.5 | −4 |
| Example 7 | poly-(dichloro)-p-xylylene | poly-(dichloro)-p-xylylene | 60 | 50 | $1 \times 10^{-12}$ | $5 \times 10^6$ | 1.6 | −2 |
| Comparative Example | none | None | 0 | 100 | $5 \times 10^{-10}$ | $1 \times 10^5$ | $1.0 \times 10^{-3}$ | −10 |

Figure 9:
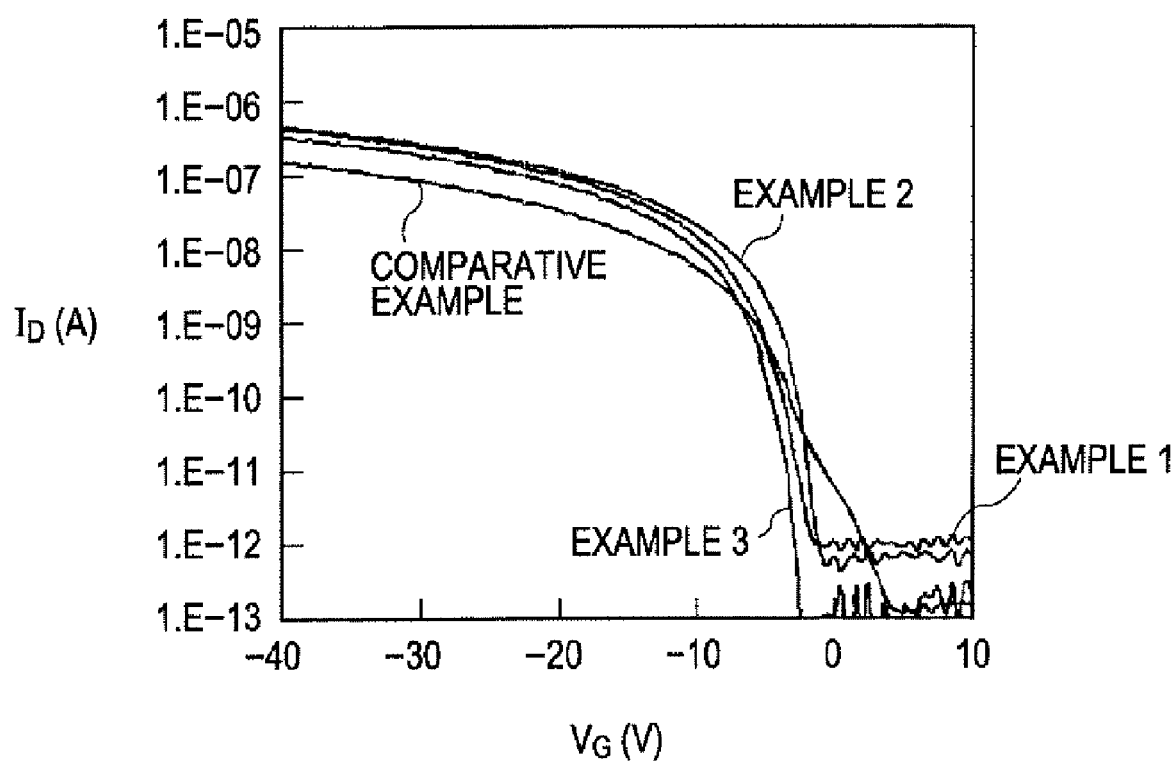
FIG. 9 is a diagram showing a relationship between a gate voltage and a drain current.

As represented in Table 1 and FIG. 9, when any of the examples is compared with a comparative example, any one of an off current, an on-off ratio, a mobility, and a threshold voltage of the examples had an excellent result, a transistor having a high performance and high reliability can be acquired in the examples. More particularly, the on-off ratio had a eight digit number in Examples 1 to 3 and a seven digit number in Examples 5 to 7, so that an excellent characteristics were acquired. From the results, it was known that excellent characteristics could be acquired by forming an recessed portion.

In addition, it was known from Examples 4 to 7 that the existence of the base insulating layer does not have an effect on the characteristics.

In addition, it was known from Examples 6 and 7 that when a compound represented by Formula 1 is included in the base insulating layer and/or the gate insulating layer, the mobility is improved much to exhibit an excellent performance.

In addition, in Example 4 to 7, a relationship between the gate voltage and the drain current is researched to exhibit a result equivalent to Examples 1 to 3.

What is claimed is:

1. A circuit board comprising:
a substrate;
source and drain electrodes formed on the substrate;
an organic semiconductor layer formed on the source and drain electrodes;
a gate insulating layer formed on the organic semiconductor layer; and
a gate electrode formed on the gate insulating layer,
wherein the substrate includes a first part, a second part, and a third part interposed between the first and second parts and a thickness of the first part or a thickness of the second part is greater than that of the third part,
wherein the source electrode is formed on the first part,
wherein the drain electrode is formed on the second part,
wherein a part of the organic semiconductor layer is formed on the third part, and
wherein a thickness of the gate insulating layer disposed on the first and second parts is smaller than that of the gate insulating layer disposed on the third part and wherein the third part is defined by a trench formed in the substrate.

2. The circuit board of claim 1, wherein a difference between a thickness of the first part or the second part and that of the third part is greater than a thickness of a part of the organic semiconductor layer which is formed on the third part.

3. A circuit board comprising:
a substrate;
a source electrode, a drain electrode, and a gate electrode disposed on one side of the substrate;
a gate insulating layer insulating the source electrode and the drain electrode from the gate electrode;
an organic semiconductor layer disposed to contact the gate insulating layer; and
a recessed portion, a bottom surface of which is disposed inside the substrate or on the substrate side disposed in a region between the source electrode and the drain electrode on which the organic semiconductor layer is formed, wherein a boundary surface between the organic semiconductor layer and the gate insulating layer is configured to be closer to a bottom surface of the substrate than boundary surfaces between the organic semiconductor layer and the gate insulating layer in other regions and wherein the recessed portion is defined by a trench in the substrate.

4. The circuit board of claim 3, wherein a part of the organic semiconductor layer located in the region between the source electrode and the drain electrode is disposed inside the substrate.

5. The circuit board of claim 3, wherein the recessed portion is formed in the region between the source electrode and the drain electrode.

6. The circuit board of claim 3, wherein the recessed portion has a depth in the range 1 to 1000 nm.

7. The circuit board of claim 3, wherein an average thickness of the organic semiconductor layer is equal to or smaller than a depth of the recessed portion.

8. The circuit board of claim 3, wherein a boundary surface between the organic semiconductor layer and the gate insulating layer in a region between the source electrode and the drain electrode is configured to be the same distance from or closer to the bottom surface of the substrate as/than boundary surfaces between the source electrode and the substrate and between the drain electrode and the substrate.

9. The circuit board of claim 1, wherein the substrate comprises:
a base body; and
a base insulating layer formed on the base body.

10. An electro-optical device comprising the circuit board of claim 1.

11. An electronic apparatus comprising the electro-optical device of claim 10.

* * * * *